United States Patent
Liao et al.

(10) Patent No.: US 12,119,271 B1
(45) Date of Patent: Oct. 15, 2024

(54) BACKSIDE GATE CONTACT, BACKSIDE GATE ETCH STOP LAYER, AND METHODS OF FORMING SAME

(71) Applicant: Taiwan Semiconductor Manufacturing Co., Ltd., Hsinchu (TW)

(72) Inventors: Yi-Bo Liao, Hsinchu (TW); Wei-De Ho, Hsinchu (TW); Cheng-Ting Chung, Hsinchu (TW); Szuya Liao, Zhubei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 18/545,337

(22) Filed: Dec. 19, 2023

(51) Int. Cl.
| | |
|---|---|
| *H01L 21/8238* | (2006.01) |
| *H01L 27/12* | (2006.01) |
| *H01L 29/06* | (2006.01) |
| *H01L 29/423* | (2006.01) |
| *H01L 29/66* | (2006.01) |
| *H01L 29/786* | (2006.01) |

(52) U.S. Cl.
CPC .... *H01L 21/823871* (2013.01); *H01L 27/124* (2013.01); *H01L 27/1266* (2013.01); *H01L 29/0673* (2013.01); *H01L 29/42392* (2013.01); *H01L 29/66787* (2013.01); *H01L 29/78696* (2013.01)

(58) Field of Classification Search
CPC .......... H01L 29/0673; H01L 29/42392; H01L 29/66787; H01L 29/78696; H01L 21/823871
See application file for complete search history.

(56) References Cited

U.S. PATENT DOCUMENTS

| | | | |
|---|---|---|---|
| 2023/0120551 A1* | 4/2023 | Lee | H01L 29/0673 257/351 |
| 2024/0072047 A1* | 2/2024 | Xie | H01L 21/8221 |
| 2024/0096805 A1* | 3/2024 | Chang | H01L 21/823871 |

OTHER PUBLICATIONS

Ryckaert et al., "Enabling Sub-5nm CMOS Technology Scaling Thinner and Taller!," 2019 IEEE International Electron Devices Meeting (IEDM), San Francisco, CA, USA, Dec. 2019, pp. 29.4.1-29.4.4.
Schuddinck et al., "Device-, Circuit- & Block-level evaluation of CFET in a 4 track library," 2019 Symposium on VLSI Technology, Kyoto, Japan, Jun. 2019, pp. T204-T205.

* cited by examiner

*Primary Examiner* — Joseph C. Nicely
(74) *Attorney, Agent, or Firm* — Slater Matsil, LLP

(57) ABSTRACT

A method includes forming a first transistor and a second transistor over a semiconductor substrate, wherein the first transistor and the second transistor are vertically stacked. The method further includes exposing a backside of a first gate stack of the first transistor; forming a backside gate etch stop layer (ESL) on the backside of the first gate stack; patterning a contact opening through the backside gate ESL to expose the first gate stack; and forming a backside gate contact in the contact opening. The backside gate contact extends through the backside gate ESL to electrically connect to the first gate stack.

20 Claims, 21 Drawing Sheets

BACKSIDE GATE CONTACT, BACKSIDE GATE ETCH STOP LAYER, AND METHODS OF FORMING SAME

BACKGROUND

Semiconductor devices are used in a variety of electronic applications such as personal computers, cell phones, digital cameras, and other electronic equipment. Semiconductor devices are typically fabricated by sequentially depositing insulating or dielectric layers, conductive layers, and semiconductor layers over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. As the semiconductor industry further progresses towards increased device density, higher performance, and lower costs, challenges from both fabrication and design have led to stacked device configurations, such as stacking transistors, which include complementary field effect transistors (CFETs). As the minimum feature sizes are reduced, however, additional features are introduced.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
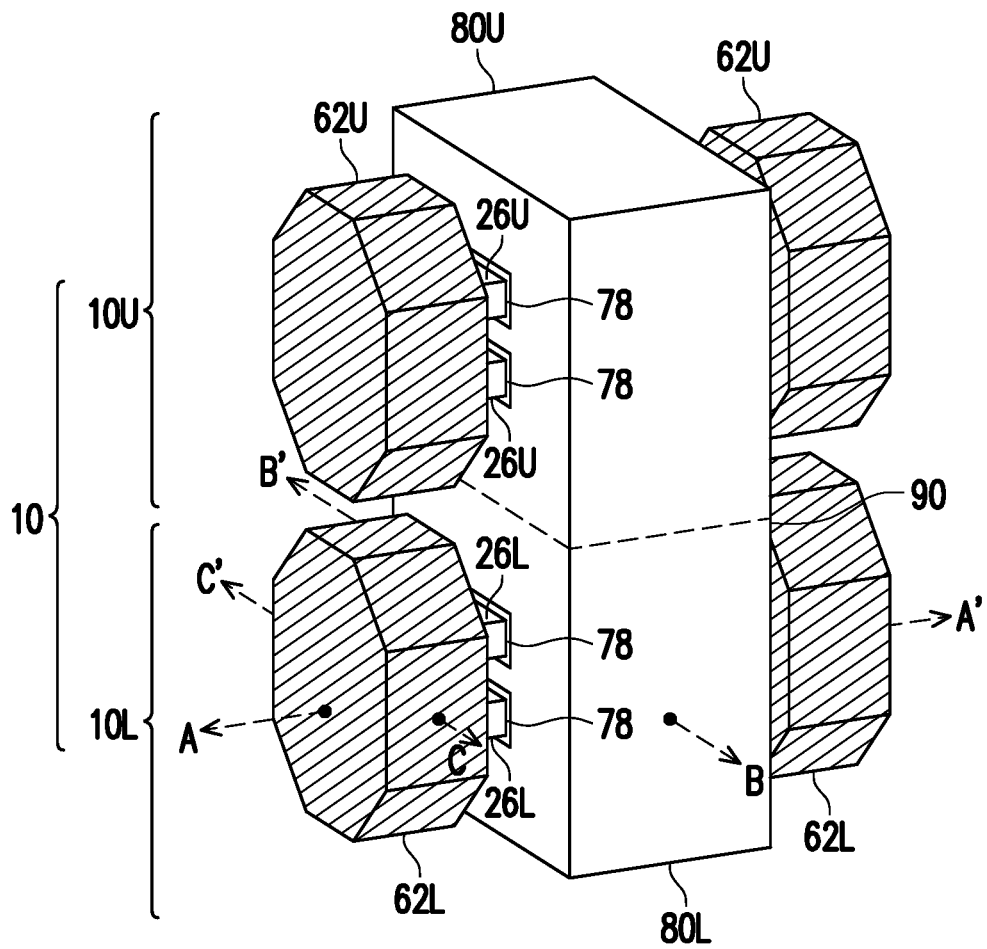
FIG. 1 illustrates a perspective view of an example stacking transistor in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A stacking transistor, such as a CFET, and the method of forming the same are provided. In various embodiments, the stacking transistor includes two vertically stacked transistors, and a gate etch stop layer (ESL) is formed on the backside of a lower gate stack of the stacking transistor. Channel regions of the stacking transistor may overlap the gate ESL. In some embodiments, the gate ESL comprise a metal such as, cobalt, titanium, tungsten, ruthenium, tantalum, aluminum, molybdenum, oxides thereof, combinations thereof, or the like. Including a backside gate ESL advantageously reduces an aspect ratio of the backside gate contact and reduces damage to the metal gate during the backside gate contact formation process. Further, by using a metal as the backside gate ESL, contact resistance between the backside gate contact and the gate electrode can be advantageously reduced.

The backside gate ESL allows for backside gate contacts to be formed to the lower gate stack at a location where the backside gate contacts are overlapped by the channel regions of the stacking transistor without damaging the channel regions during the backside gate contact formation process. As a result, the locations overlapped by channel regions do not need to be avoided when forming the backside gate contacts, allowing for improved routing flexibility. Further, because channel regions are able to directly overlap the backside gate contacts, channel regions can be designed and fabricated with larger widths for improved device speed. For example, between 14.4% to 19% device speed improvements have been observed in embodiment devices by increasing the widths of the channel regions. As a result, various embodiments allow for improved process integration, increased routing flexibility, and increased device performance.

FIG. 1 illustrates an example of a stacking transistor 10 (including FETs (transistors) 10U and 10L) in accordance with some embodiments. FIG. 1 is a three-dimensional view, and some features of the stacking transistor are omitted for illustration clarity.

The stacking transistor includes multiple vertically stacked FETs. For example, a stacking transistor may include a lower nanostructure-FET 10L of a first device type (e.g., n-type/p-type) and an upper nanostructure-FET 10U of a second device type (e.g., p-type/n-type). When the stacking transistor is a CFET, the second device type of the upper nanostructure-FET 10U is opposite to the first device type of the lower nanostructure-FET 10L. The nanostructure-FETs 10U and 10L include semiconductor nanostructures 26 (including lower semiconductor nanostructures 26L and upper semiconductor nanostructures 26U), where the semiconductor nanostructures 26 act as the channel regions for the nanostructure-FETs. The lower semiconductor nanostructures 26L are for the lower nanostructure-FET 10L, and the upper semiconductor nanostructures 26U are for the upper nanostructure-FET 10U. In other embodiments, the stacking transistors may be applied to other types of transistors (e.g., finFETs, or the like) as well.

Gate dielectrics 78 encircle the respective semiconductor nanostructures 26. Gate electrodes 80 (including a lower gate electrode 80L and an upper gate electrode 80U) are over the gate dielectrics 78. Source/drain regions 62 (including lower source/drain regions 62L and upper source/drain regions 62U) are disposed on opposing sides of the gate dielectrics 78 and the respective gate electrodes 80. Each of the source/drain regions 62 may refer to a source or a drain, individually or collectively dependent upon the context. Isolation features (not shown) may be formed to separate desired ones of the source/drain regions 62 and/or desired ones of the gate electrodes 80.

FIG. 1 further illustrates reference cross-sections that are used in later figures. Cross-section A-A' is a vertical cross-section that is parallel to a longitudinal axis of the semiconductor nanostructures 26 of the stacking transistor 10 and in a direction of, for example, a current flow between the source/drain regions 62 of the stacking transistor 10. Cross-section B-B' is a vertical cross-section that is perpendicular to cross-section A-A' and along a longitudinal axis of a gate electrodes 80 of the stacking transistor 10.

Figure 2:
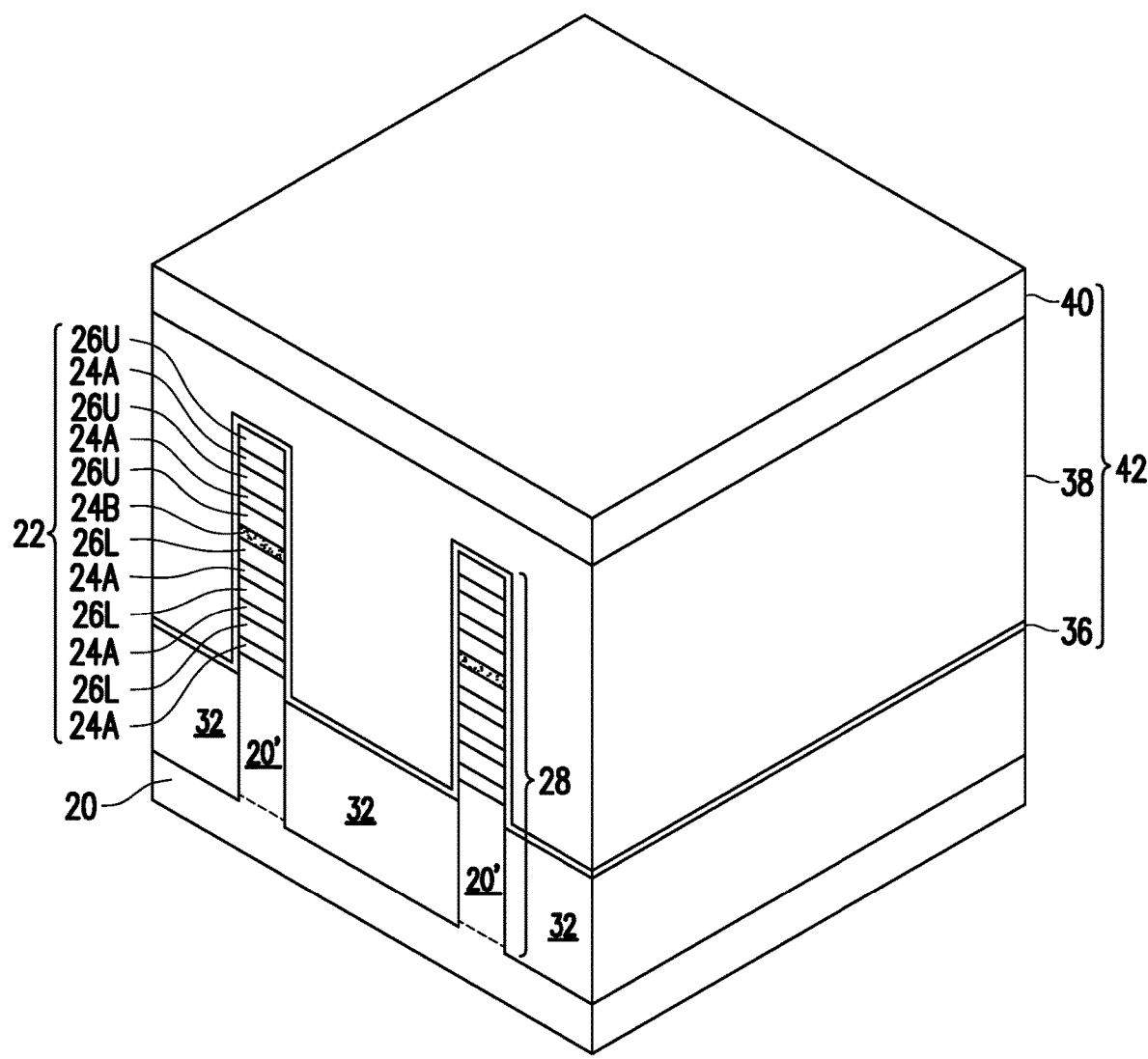
FIGS. 2, 3, 4, 5A, 5B, 6, 7, 8, 9, 10, 11A, and 11B are views of intermediate stages in the manufacturing of a stacking transistor in accordance with some embodiments.

FIGS. 2 through 11B illustrate varying views of intermediate stages in the formation of stacking transistors (as schematically represented in FIG. 1) in accordance with some embodiments. FIG. 2 illustrates a perspective view similar to FIG. 1. FIGS. 3, 4, 5A, 6, and 11A illustrate cross-sectional views along a similar cross-section as reference cross-section A-A' in FIG. 1. FIGS. 5B, 7, 8, 9, 10, and 11B illustrate cross-sectional views along a similar cross-section as reference cross-section B-B' in FIG. 1.

In FIG. 2, a wafer, which includes substrate 20, is provided. Substrate 20 may be a semiconductor substrate, such as a bulk semiconductor, which may be doped (e.g., with a p-type or an n-type dopant) or undoped. Other substrates, such as a multi-layered or gradient substrate may also be used. In some embodiments, the semiconductor material of the substrate 20 may include silicon, germanium, carbon-doped silicon, a III-V compound semiconductor; or the like, or combinations thereof. In some embodiments, each of the substrate 20 may include an embedded CMP stop layer (not separately illustrated), such as a layer of silicon germanium embedded (e.g., sandwiched) between silicon material layers.

Semiconductor strips 28 are formed extending upwards from the semiconductor substrate 20. Each of semiconductor strips 28 includes semiconductor strip 20' (patterned portions of the semiconductor substrate 20, also referred to as a semiconductor fin 20') and a multi-layer stack 22. The stacked component of the multi-layer stack 22 is referred to as nanostructures hereinafter. Specifically, the multi-layer stack 22 includes dummy nanostructures 24A, dummy nanostructures 24B, lower semiconductor nanostructures 26L, and upper semiconductor nanostructures 26U. Dummy nanostructures 24A and dummy nanostructures 24B may further be collectively referred to as dummy nanostructures 24, and the lower semiconductor nanostructures 26L and the upper semiconductor nanostructures 26U may further be collectively referred to as semiconductor nanostructures 26.

The dummy nanostructures 24A are formed of a first semiconductor material, and the dummy nanostructures 24B is formed of a second semiconductor material different from the first semiconductor material. The first and second semiconductor materials may be selected from the candidate semiconductor materials of the substrate 20. The first and second semiconductor materials have a high etching selectivity to one another. As such, the dummy nanostructures 24B may be removed at a faster rate than the dummy nanostructures 24A in subsequent processes.

The semiconductor nanostructures 26 (including the lower semiconductor nanostructures 26L and upper semiconductor nanostructures 26U) are formed of one or more third semiconductor material(s). The third semiconductor material(s) may be selected from the candidate semiconductor materials of the substrate 20. The lower semiconductor nanostructures 26L and the upper semiconductor nanostructures 26U may be formed of the same semiconductor material, or may be formed of different semiconductor materials. Further, the first and second semiconductor materials of the dummy nanostructures 24 have a high etching selectivity to the third semiconductor material(s) of the semiconductor nanostructures 26. As such, the dummy nanostructures 24 may be selectively removed in subsequent process steps without significantly removing the semiconductor nanostructures 26. In some embodiments, the dummy nanostructures 24A are formed of or comprise silicon germanium, the semiconductor nanostructures 26 are formed of silicon, and dummy semiconductor nanostructures 24B may be formed of germanium or silicon germanium with a higher germanium atomic percentage than the dummy nanostructures 24A.

The lower semiconductor nanostructures 26L will provide channel regions for lower nanostructure-FETs of the CFETs. The upper semiconductor nanostructures 26U will provide channel regions for upper nanostructure-FETs of the CFETs. The semiconductor nanostructures 26 that are immediately above/below (e.g., in contact with) the dummy nanostructures 24B may be used for isolation and may or may not act as channel regions for the CFETs. The dummy nanostructures 24B will be subsequently replaced with isolation structures that define boundaries of the lower nanostructure-FETs and the upper nanostructure-FETs.

To form the semiconductor strips 28, layers of the first, second, and third semiconductor materials (arranged as illustrated and described above) may be deposited over the semiconductor substrate 20. The layers of the first, second, and third semiconductor materials may be grown by a process such as Vapor Phase Epitaxy (VPE) or Molecular Beam Epitaxy (MBE), deposited by a process such as Chemical Vapor Deposition (CVD) process or an Atomic Layer deposition (ALD) process, or the like. Then, a patterning process may be applied to the layers of the first, second, and third semiconductor materials as well as the semiconductor substrate 20 to define the semiconductor strips 28, which includes the semiconductor fins 20', the dummy nanostructures 24, and the semiconductor nanostructures 26. The semiconductor fins and the nanostructures may be patterned by any suitable method. For example, the patterning process may include one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used as an etching mask for the patterning process to etch the layers of the first, second, and third semiconductor materials and the semiconductor substrate 20. The etching may be performed by any acceptable etch process, such as a Reactive Ion Etch (RIE), Neutral Beam Etch (NBE), the like, or a combination thereof. The etching may be anisotropic.

As also illustrated by FIG. 2, STI regions 32 are formed over the substrate 20 and between adjacent semiconductor strips 28. STI regions 32 may include a dielectric liner and a dielectric material over the dielectric liner. Each of the dielectric liner and the dielectric material may include an oxide such as silicon oxide, a nitride, such as silicon nitride, the like, or a combination thereof. The formation of the STI regions 32 may include depositing the dielectric layer(s), and performing a planarization process such as a Chemical Mechanical Polish (CMP) process, a mechanical polishing process, or the like to remove excess portions of the dielectric materials. The deposition processes may include ALD, High-Density Plasma CVD (HDP-CVD), Flowable CVD (FCVD), the like, or a combination thereof. In some embodiments, the STI regions 32 include silicon oxide formed by an FCVD process, followed by an anneal process. Then, the dielectric layers(s) are recessed to define the STI regions 32. The dielectric layer(s) maybe recessed such that upper portions of semiconductor strips 28 (including multi-layer stacks 22) protrude higher than the remaining STI regions 32. Although FIG. 2 illustrates a top surface of the STI regions 32 as being flat, the top surface of the STI regions 32 may be concave (see more detailed drawing of FIGS. 5B and 7) depending on the etching process used to recess the STI regions 32.

After the STI regions 32 are formed, dummy gate stacks 42 may be formed over and along sidewalls of the upper portions of the semiconductor strips 28 (the portions that protrude higher than the STI regions 32). Forming the dummy gate stacks 42 may include forming dummy dielectric layer 36 on the semiconductor strips 28. Dummy dielectric layer 36 may be formed of or comprise, for example, silicon oxide, silicon nitride, a combination thereof, or the like, and may be deposited or thermally grown according to acceptable techniques. A dummy gate layer 38 is formed over the dummy dielectric layer 36. The dummy gate layer 38 may be deposited, for example, through Physical Vapor Deposition (PVD), CVD, or other techniques, and then planarized, such as by a CMP process. The material of dummy gate layer 38 be conductive or non-conductive, and may be selected from a group including amorphous silicon, polycrystalline-silicon (polysilicon), poly-crystalline silicon-germanium (poly-SiGe), or the like. A mask layer 40 is formed over the planarized dummy gate layer 38, and may include, for example, silicon nitride, silicon oxynitride, or the like. Next, the mask layer 40 may be patterned through photolithography and etching processes to form a mask, which is then used to etch and pattern dummy gate layer 38, and possibly the dummy dielectric layer 36. The remaining portions of mask layer 40, dummy gate layer 38, and dummy dielectric layer 36 form dummy gate stacks 42.

Figure 3:
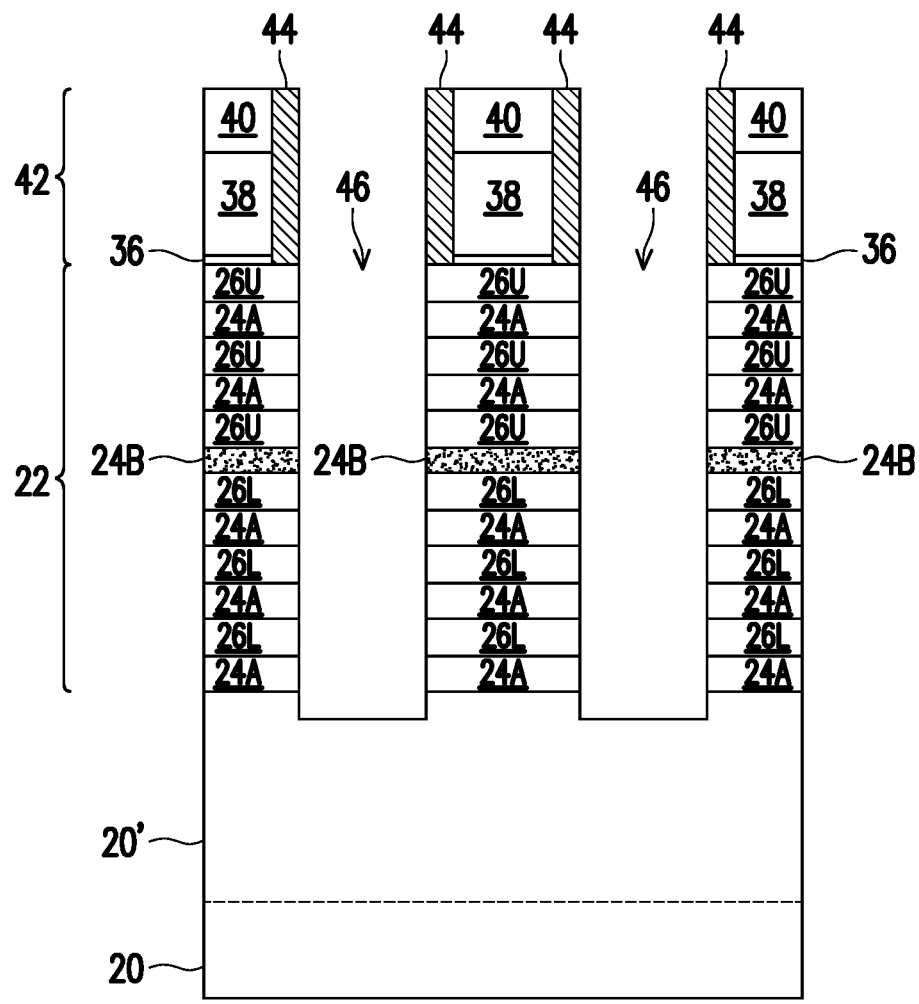

In FIG. 3, gate spacers 44 and source/drain recesses 46 are formed. First, the gate spacers 44 are formed over the multi-layer stacks 22 and on exposed sidewalls of dummy gate stacks 42. The gate spacers 44 may be formed by conformally forming one or more dielectric layers and subsequently etching the dielectric layers anisotropically. The applicable dielectric materials may include silicon oxide, silicon nitride, silicon oxynitride, silicon oxycarbonitride, or the like, which may be formed by a deposition process such as CVD, ALD, or the like.

Subsequently, source/drain recesses 46 are formed in semiconductor strips 28. The source/drain recesses 46 are formed through etching, and may extend through the multi-layer stacks 22 and into the semiconductor strips 20'. The bottom surfaces of the source/drain recesses 46 may be at a level above, below, or level with the top surfaces of the isolation regions 32. In the etching processes, the gate spacers 44 and the dummy gate stacks 42 mask some portions of the semiconductor strips 28. The etching may include a single etch process or multiple etch processes. Timed etch processes may be used to stop the etching of the source/drain recesses 46 upon source/drain recesses 46 reaching a desired depth.

Figure 4:
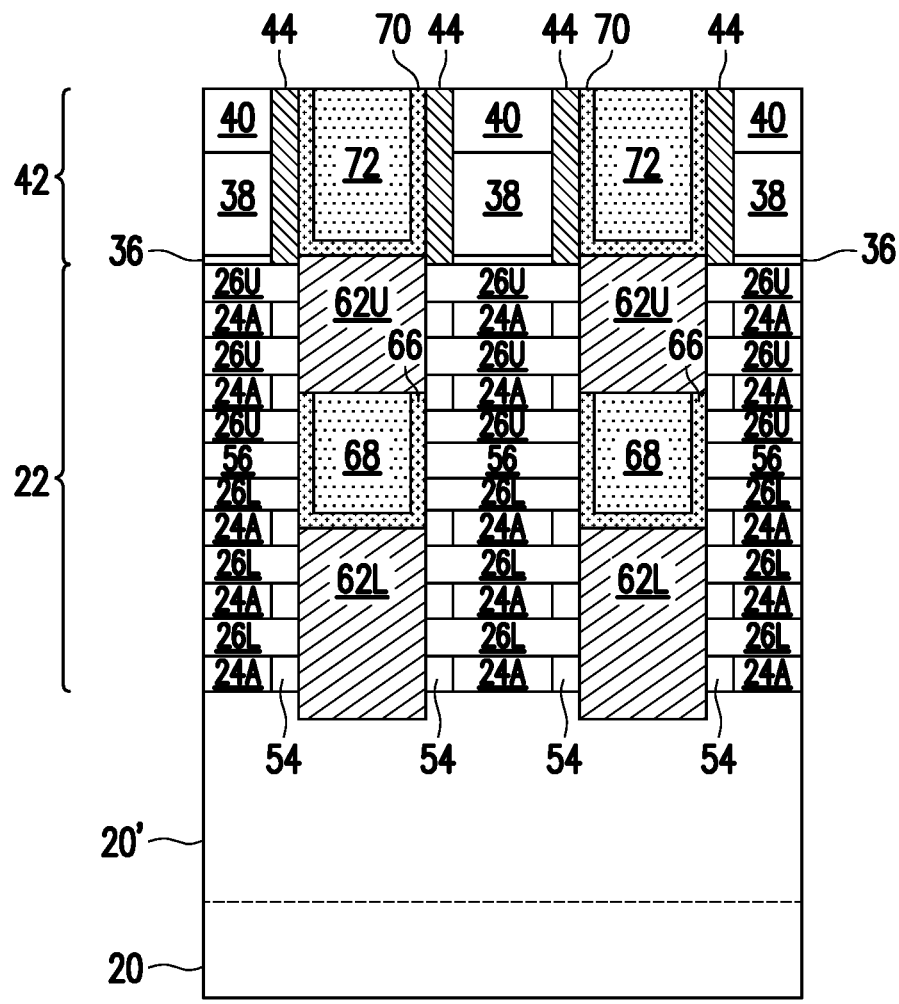

In FIG. 4, inner spacers 54 and dielectric isolation layers 56 are formed. Forming inner spacers 54 and dielectric isolation layers 56 may include an etching process that laterally etches the dummy nanostructures 24A and removes the dummy nanostructure 24B. The etching process may be isotropic and may be selective to the material of the dummy nanostructures 24, so that the dummy nanostructures 24 are etched at a faster rate than the semiconductor nanostructures 26. The etching process may also be selective to the material of the dummy nanostructures 24B, so that the dummy nanostructures 24B are etched at a faster rate than the dummy nanostructures 24A. In this manner, the dummy nanostructures 24B may be completely removed from between the lower semiconductor nanostructures 26L (collectively) and the upper semiconductor nanostructures 26U (collectively) without completely removing the dummy nanostructures 24A. In some embodiments where the dummy nanostructures 24B are formed of germanium or silicon germanium with a high germanium atomic percentage, the dummy nanostructures 24A are formed of silicon germanium with a low germanium atomic percentage, and the semiconductor nanostructures 26 are formed of silicon free from germanium, the etch process may comprise a dry etch process using chlorine gas, with or without a plasma. Because the dummy gate stacks 42 warp around sidewalls of the semiconductor nanostructures 26 (see FIG. 2), the dummy gate stacks 42 may support the upper semiconductor nanostructures 26U so that the upper semiconductor nanostructures 26U do not collapse upon removal of the dummy nanostructures 24B. Further, although sidewalls of the dummy nanostructures 24A are illustrated as being straight after the etching, the sidewalls may be concave or convex.

Inner spacers 54 are formed on sidewalls of the recessed dummy nanostructures 24A, and dielectric isolation layers 56 are formed between the upper semiconductor nanostructures 26U (collectively) and the lower semiconductor nanostructures 26L (collectively). As subsequently described in greater detail, source/drain regions will be subsequently formed in the source/drain recesses 46, and the dummy nanostructures 24A will be replaced with corresponding gate structures. The inner spacers 54 act as isolation features between the subsequently formed source/drain regions and the subsequently formed gate structures. Further, the inner spacers 54 may be used to prevent damage to the subsequently formed source/drain regions by subsequent etch processes, such as the etch processes used to form gate structures. Dielectric isolation layers 56, on the other hand, are used to isolate the upper semiconductor nanostructures 26U (collectively) from the lower semiconductor nanostructures 26L (collectively). Further, middle semiconductor nanostructures (ones of the semiconductor nanostructures 26 in contact with the dielectric isolation layers 56) and the dielectric isolation layers 56 may define the boundaries of the lower nanostructure-FETs and the upper nanostructure-FETs.

The inner spacers 54 and the dielectric isolation layers 56 may be formed by conformally depositing an insulating material in the source/drain recesses 46, on sidewalls of the dummy nanostructures 24, and between the upper and lower semiconductor nanostructures 26U and 26L, and then etching the insulating material. The insulating material may be a hard dielectric material, such as a carbon-containing dielectric material, such as silicon oxycarbonitride, silicon oxycarbide, silicon oxynitride, or the like. Other low-dielectric constant (low-k) materials having a k-value less than about 3.5 may be utilized. The insulating material may be formed by a deposition process, such as ALD, CVD, or the like. The etching of the insulating material may be anisotropic or isotropic. The insulating material, when etched, has portions remaining in the sidewalls of the dummy nanostructures 26A (thus forming the inner spacers 54) and has portions remaining in between the upper and lower semiconductor nanostructures 26U and 26L (thus forming the dielectric isolation layers 56).

As also illustrated by FIG. 4, lower and upper epitaxial source/drain regions 62L and 62U are formed. The lower epitaxial source/drain regions 62L are formed in the lower portions of the source/drain recesses 46. The lower epitaxial source/drain regions 62L are in contact with the lower semiconductor nanostructures 26L and are not in contact with the upper semiconductor nanostructures 26U. Inner spacers 54 electrically insulate the lower epitaxial source/drain regions 62L from the dummy nanostructures 24A, which will be replaced with replacement gates in subsequent processes.

The lower epitaxial source/drain regions 62L are epitaxially grown, and have a conductivity type that is suitable for the device type (p-type or n-type) of the lower nanostructure-FETs. When lower epitaxial source/drain regions 62L are n-type source/drain regions, the respective material may include silicon or carbon-doped silicon, which is doped with an n-type dopant such as phosphorous, arsenic, or the like. When lower epitaxial source/drain regions 62L are p-type source/drain regions, the respective material may include silicon or silicon germanium, which is doped with a p-type dopant such as boron, indium, or the like. The lower epitaxial source/drain regions 62L may be in-situ doped, and may be, or may not be, implanted with the corresponding p-type or n-type dopants. During the epitaxy of the lower epitaxial source/drain regions 62L, exposed surfaces of the upper semiconductor nanostructures 26U (e.g., sidewalls) may be masked to prevent undesired epitaxial growth on the upper semiconductor nanostructures 26U. After the lower epitaxial source/drain regions 62L are grown, the masks on the upper semiconductor nanostructures 26U may then be removed.

As a result of the epitaxy processes used for forming the lower epitaxial source/drain regions 62L, upper surfaces of the lower epitaxial source/drain regions 62L have facets which expand laterally outward beyond sidewalls of the multi-layer stacks 22. In some embodiments, adjacent lower epitaxial source/drain regions 62L remain separated after the epitaxy process is completed. In other embodiments, these facets cause neighboring lower epitaxial source/drain regions 62L of a same FET to merge.

A first contact etch stop layer (CESL) 66 and a first ILD 68 are formed over the lower epitaxial source/drain regions 62L. The first CESL 66 may be formed of a dielectric material having a high etching selectivity from the etching of the first ILD 68, such as silicon nitride, silicon oxide, silicon oxynitride, or the like, which may be formed by any suitable deposition process, such as CVD, ALD, or the like. The first ILD 68 may be formed of a dielectric material, which may be deposited by any suitable method, such as CVD, plasma-enhanced CVD (PECVD), or FCVD. The applicable dielectric material of the first ILD 68 may include phospho-silicate glass (PSG), boro-silicate glass (BSG), boron-doped phospho-silicate glass (BPSG), undoped silicate glass (USG), silicon oxide, or the like.

The formation processes may include depositing a conformal CESL layer, depositing a material for the first ILD 68, followed by a planarization process and then an etchback process. In some embodiments, the first ILD 68 is etched first, leaving the first CESL 66 unetched. An anisotropic etching process is then performed to remove the portions of the first CESL 66 higher than the recessed first ILD 68. After the recessing, the sidewalls of the upper semiconductor nanostructures 26U are exposed.

Upper epitaxial source/drain regions 62U are then formed in the upper portions of the source/drain recesses 46. The upper epitaxial source/drain regions 62U may be epitaxially grown from exposed surfaces of the upper semiconductor nanostructures 26U. The materials of upper epitaxial source/drain regions 62U may be selected from the same candidate group of materials for forming lower source/drain regions 62L, depending on the desired conductivity type of upper epitaxial source/drain regions 62U. The conductivity type of the upper epitaxial source/drain regions 62U may be opposite the conductivity type of the lower epitaxial source/drain regions 62L in embodiments where the stacking transistors are CFETs. For example, the upper epitaxial source/drain regions 62U may be oppositely doped from the lower epitaxial source/drain regions 62L. Alternatively, the conductivity types of the upper epitaxial source/drain regions 62U and the lower epitaxial source/drain regions 62L may be the same. The upper epitaxial source/drain regions 62U may be in-situ doped, and/or may be implanted, with an n-type or p-type dopant. Adjacent upper source/drain regions 62U may remain separated after the epitaxy process or may be merged.

After the epitaxial source/drain regions 62U are formed, a second CESL 70 and a second ILD 72 are formed. The materials and the formation methods may be similar to the materials and the formation methods of first CESL 66 and first ILD 68, respectively, and are not discussed in detail herein. The formation process may include depositing the layers for the second CESL 70 and the second ILD 72, and performing a planarization process to remove the excess portion of the corresponding layers. After the planarization process, top surfaces of the second ILD 72, the gate spacers 44, and the masks 86 (if present) or the dummy gates 84 are substantially coplanar (within process variations). Accordingly, the top surfaces of the masks 40 (if present) or the dummy gates 38 are exposed through the second ILD 72. In the illustrated embodiment, the masks 40 remain after the removal process. In other embodiments, the masks 40 are removed such that the top surfaces of the dummy gates 38 are exposed through the second ILD 72.

Figure 5A:
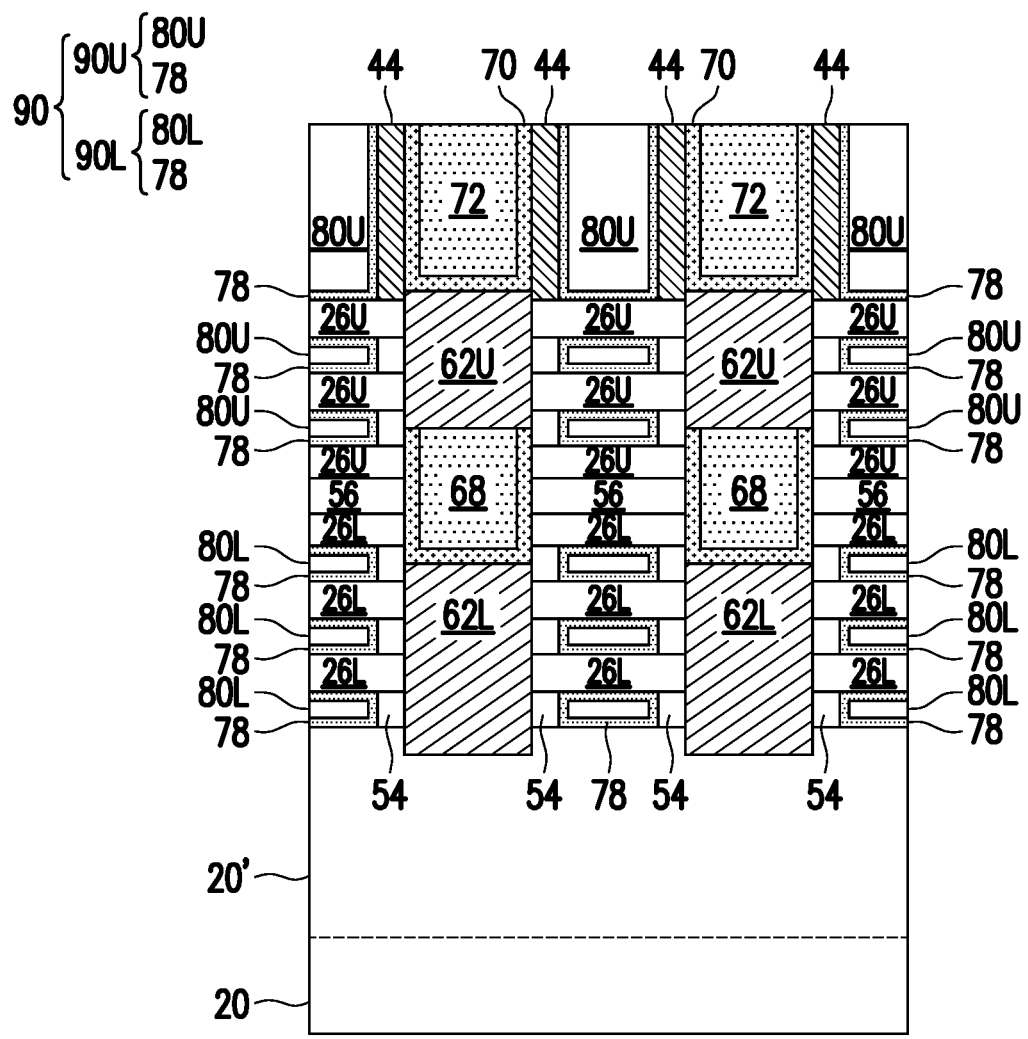
Figure 5B:
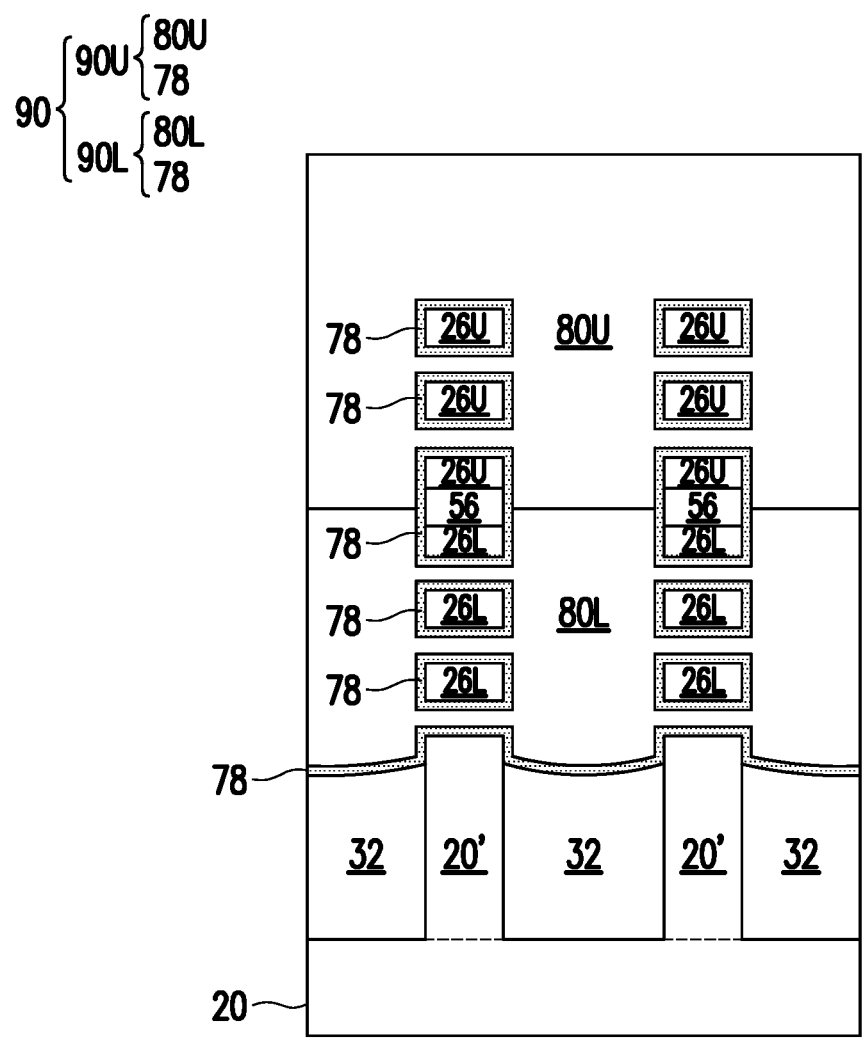

FIGS. 5A and 5B illustrate different cross-sections of a replacement gate process to replace the dummy gate stacks 42 and the dummy nanostructures 24A with gate stacks 90. FIG. 5A illustrates a cross-sectional view along reference line A-A' of FIG. 1; and FIG. 5B illustrates a cross-sectional view along reference line B-B' of FIG. 1. The replacement gate process includes first removing the dummy gate stacks 42 and the remaining portions of the dummy nanostructures 24A. The dummy gate stacks 42 are removed in one or more etching processes, so that recesses are defined between the gate spacers 44 and the upper portions of the semiconductor strips 28 are exposed. The remaining portions of the dummy nanostructures 24A are then removed through etching, so that the recesses extend between the semiconductor nanostructures 26. In the etching process, the dummy nanostructures 24A is etched at a faster rate than the semiconductor nanostructures 26, the dielectric isolation layers 56, and the inner spacers 54. The etching may be isotropic. For example, when the dummy nanostructures 24A are formed of silicon-germanium, and the semiconductor nanostructures 26 are formed of silicon, the etch process may include a wet etch process using tetramethylammonium hydroxide (TMAH), ammonium hydroxide (NH$_4$OH), or the like.

Then, gate dielectrics 78 are deposited in the recesses between the gate spacers 44 and on the exposed semiconductor nanostructures 26. The gate dielectrics 78 are conformally formed on the exposed surfaces of the recesses (the removed dummy gate stacks 42 and the dummy nanostructures 24A) including the semiconductor nanostructures 26 and the gate spacers 44. In some embodiments, the gate dielectrics 78 wrap around all (e.g., four) sides of the semiconductor nanostructures 26. Specifically, the gate dielectrics 78 may be formed on the top surfaces of the semiconductor fins 20'; on the top surfaces, the sidewalls, and the bottom surfaces of the semiconductor nanostructures 26; and on the sidewalls of the gate spacers 44. The gate dielectrics 78 may include an oxide such as silicon oxide or a metal oxide, a silicate such as a metal silicate, combinations thereof, multi-layers thereof, or the like. The gate dielectrics 78 may include a high-dielectric constant (high-k) material having a k-value greater than about 7.0, such as a metal oxide or a silicate of hafnium, aluminum, zirconium, lanthanum, manganese, barium, titanium, lead, and combinations thereof. The gate dielectrics 78 may be deposited with a conformal deposition process such that portions of the gate dielectrics 78 on the STI regions 32 may have a same profile as an upper surface of the STI regions 32 (e.g., a concave profile as illustrated by FIG. 5B). The formation methods of the gate dielectrics 78 may include molecular-beam deposition (MBD), ALD, PECVD, and the like followed by a planarization process (e.g., a CMP) to remove portions of the gate dielectrics 78 above the second ILD 72. Although single-layered gate dielectrics 78 are illustrated, the gate dielectrics 78 may include multiple layers, such as an interfacial layer and an overlying high-k dielectric layer.

Lower gate electrodes 80L are formed on the gate dielectrics 78 around the lower semiconductor nanostructures 26L. For example, the lower gate electrodes 80L wrap around the lower semiconductor nanostructures 26L. The lower gate electrodes 80L may be formed of a metal-containing material such as tungsten, titanium, titanium nitride, tantalum, tantalum nitride, tantalum carbide, aluminum, ruthenium, cobalt, combinations thereof, multi-layers thereof, or the like. Although single-layered gate electrodes are illustrated, the lower gate electrodes 80L may include any number of work function tuning layers, any number of barrier layers, any number of glue layers, and a fill material.

The lower gate electrodes 80L are formed of material(s) that are suitable for the device type of the lower nanostructure-FETs. For example, the lower gate electrodes 80L may include one or more work function tuning layer(s) formed of material(s) that are suitable for the device type of the lower nanostructure-FETs. In some embodiments, the lower gate electrodes 80L include an n-type work function tuning layer, which may be formed of titanium aluminum, titanium aluminum carbide, tantalum aluminum, tantalum carbide, combinations thereof, or the like. In some embodiments, the lower gate electrodes 80L include a p-type work function tuning layer, which may be formed of titanium nitride, tantalum nitride, combinations thereof, or the like. Additionally or alternatively, the lower gate electrodes 80L may include a dipole-inducing element that is suitable for the device type of the lower nanostructure-FETs. Acceptable dipole-inducing elements include lanthanum, aluminum, scandium, ruthenium, zirconium, erbium, magnesium, strontium, and combinations thereof.

The lower gate electrodes 80L may be formed by conformally depositing one or more gate electrode layer(s) recessing the gate electrode layer(s). The conformal deposition process for depositing the lower gate electrodes 80L may result in the portions of the lower gate electrodes 80L on the STI regions 32 having a same profile as an upper surface of the STI regions 32 (e.g., a concave profile as illustrated by FIG. 5B). Any acceptable etch process, such as a dry etch, a wet etch, the like, or a combination thereof, may be performed to recess the gate electrode layer(s). The etching may be isotropic. Etching the lower gate electrodes 80L may expose the upper semiconductor nanostructures 26U.

In some embodiments, isolation layers (not explicitly illustrated) may be optionally formed on the lower gate electrodes 80L. The isolation layers act as isolation features between the lower gate electrodes 80L and subsequently formed upper gate electrodes 80U. The isolation layers may be formed by conformally depositing a dielectric material (e.g., silicon oxide, silicon nitride, silicon oxynitride, silicon oxycarbonitride, combinations thereof, or the like) and subsequently recessing the dielectric material to expose the upper semiconductor nanostructures 26U.

Then, upper gate electrodes 80U are formed on the isolation layers described above (if present) or the lower gate electrodes 80L. The upper gate electrodes 80U are disposed between the upper semiconductor nanostructures 26U. In some embodiments, the upper gate electrodes 80U wrap around the upper semiconductor nanostructures 26U. The upper gate electrodes 80U may be formed of the same candidate materials and candidate processes for forming the lower gate electrodes 80L. The upper gate electrodes 80U are formed of material(s) that are suitable for the device type of the upper nanostructure-FETs. For example, the upper gate electrodes 80U may include one or more work function tuning layer(s) (e.g., n-type work function tuning layer(s) and/or p-type work function tuning layer(s)) formed of material(s) that are suitable for the device type of the upper nanostructure-FETs. Although single-layered gate electrodes 80U are illustrated, the upper gate electrodes 80U may include any number of work function tuning layers, any number of barrier layers, any number of glue layers, and a fill material.

Additionally, a removal process is performed to level top surfaces of the upper gate electrodes 80U and the second ILD 72. The removal process for forming the gate dielectrics 78 may be the same removal process as the removal process for forming the upper gate electrodes 80U. In some embodiments, a planarization process such as a chemical mechanical polish (CMP), an etch-back process, combinations thereof, or the like may be utilized. After the planarization process, the top surfaces of the upper gate electrodes 80U, the gate dielectrics 78, the second ILD 72, and the gate spacers 44 are substantially coplanar (within process variations). Each respective pair of a gate dielectric 78 and a gate electrode 80 (including an upper gate electrode 80U and/or a lower gate electrode 80L) may be collectively referred to as a "gate structure" 90 (including upper gate structures 90U and lower gate structures 90L). Each gate stack 90 extends along three sides (e.g., a top surface, a sidewall, and a bottom surface) of a channel region of a semiconductor nanostructure 26 (see FIG. 1). The lower gate structures 90L may also extend along sidewalls and/or a top surface of a semiconductor fin 20'.

Figure 6:
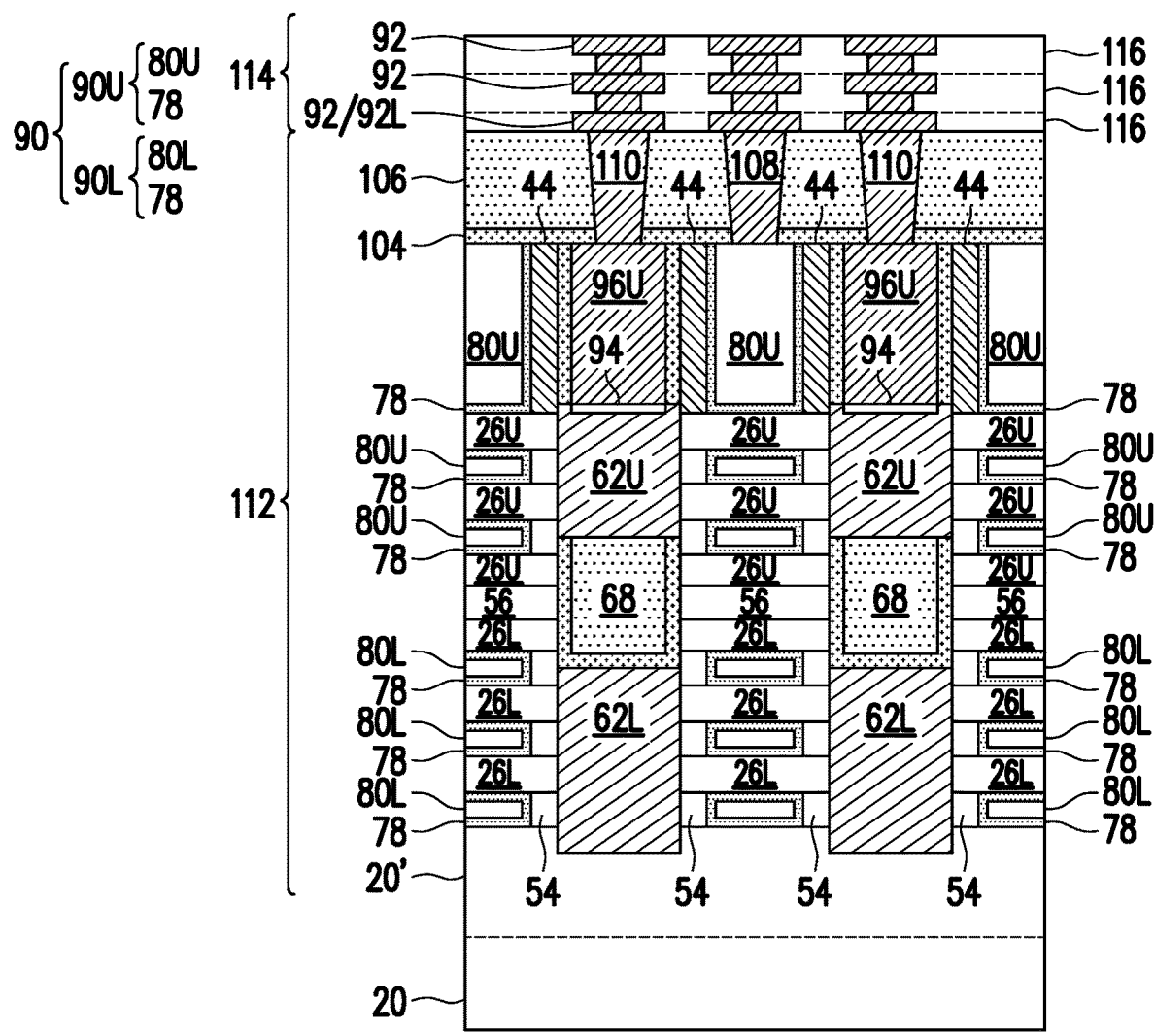

In FIG. 6, metal-semiconductor alloy regions 94 and source/drain contacts 96 are formed through the second ILD 72 to electrically couple to the upper epitaxial source/drain regions 62U and/or the lower epitaxial source/drain regions 62L. As an example to form the source/drain contacts 96, openings are formed through the second ILD 72 and the second CESL 70 using acceptable photolithography and etching techniques. A liner (not separately illustrated), such as a diffusion barrier layer, an adhesion layer, or the like, and a conductive material are formed in the openings. The liner may include titanium, titanium nitride, tantalum, tantalum nitride, or the like. The conductive material may be cobalt, tungsten, copper, a copper alloy, silver, gold, aluminum, nickel, or the like. A removal process may be performed to remove excess material from the top surfaces of the gate spacers 44 and the second ILD 72. The remaining liner and conductive material form the source/drain contacts 96 in the openings. In some embodiments, a planarization process such as a CMP, an etch-back process, combinations thereof, or the like is utilized. After the planarization process, the top surfaces of the gate spacers 44, the second ILD 72, and the source/drain contacts 96 are substantially coplanar (within process variations).

Optionally, metal-semiconductor alloy regions 94 are formed at the interfaces between the source/drain regions 62 and the source/drain contacts 96. The metal-semiconductor alloy regions 94 can be silicide regions formed of a metal silicide (e.g., titanium silicide, cobalt silicide, nickel silicide, etc.), germanide regions formed of a metal germanide (e.g. titanium germanide, cobalt germanide, nickel germanide, etc.), silicon-germanide regions formed of both a metal silicide and a metal germanide, or the like. The metal-semiconductor alloy regions 94 can be formed before the material(s) of the source/drain contacts 96 by depositing a metal in the openings for the source/drain contacts 96 and then performing a thermal anneal process. The metal can be any metal capable of reacting with the semiconductor materials (e.g., silicon, silicon-germanium, germanium, etc.) of the source/drain regions 62 to form a low-resistance metal-semiconductor alloy, such as nickel, cobalt, titanium, tantalum, platinum, tungsten, other noble metals, other refractory metals, rare earth metals or their alloys. The metal can be deposited by a deposition process such as ALD, CVD, PVD, or the like. After the thermal anneal process, a cleaning process, such as a wet clean, may be performed to remove any residual metal from the openings for the source/drain contacts 96, such as from surfaces of the metal-semiconductor alloy regions 94. The material(s) of the source/drain contacts 96 can then be formed on the metal-semiconductor alloy regions 94.

An ESL 104 and a third ILD 106 are then formed. In some embodiments, The ESL 104 may include a dielectric material having a high etching selectivity from the etching of the third ILD 106, such as, aluminum oxide, aluminum nitride, silicon oxycarbide, or the like. The third ILD 106 may be formed using flowable CVD, ALD, or the like, and the material may include PSG, BSG, BPSG, USG, or the like, which may be deposited by any suitable method, such as CVD, PECVD, or the like.

Subsequently, gate contacts 108 and source/drain vias 110 are formed to contact the upper gate electrodes 80U and the source/drain contacts 96, respectively. As an example to form the gate contacts 108 and the source/drain vias 110, openings for the gate contacts 108 and the source/drain vias 110 are formed through the third ILD 106 and the ESL 104. The openings may be formed using acceptable photolithography and etching techniques. A liner (not separately illustrated), such as a diffusion barrier layer, an adhesion layer, or the like, and a conductive material are formed in the openings. The liner may include titanium, titanium nitride, tantalum, tantalum nitride, or the like. The conductive material may be cobalt, tungsten, copper, a copper alloy, silver, gold, aluminum, nickel, or the like. A planarization process, such as a CMP, may be performed to remove excess material from the top surface of the third ILD 106. The remaining liner and conductive material form the gate contacts 108 and the source/drain vias 110 in the openings. The gate contacts 108 and the source/drain vias 110 may be formed in distinct processes, or may be formed in the same process. Although shown as being formed in the same cross-section, it should be appreciated that each of the gate contacts 108 and the source/drain vias 110 may be formed in different cross-sections, which may avoid shorting of the contacts.

A front-side interconnect structure 114 is formed on the device layer 112. The front-side interconnect structure 114 includes dielectric layers 116 and layers of conductive features 118 in the dielectric layers 116. The dielectric layers 116 may include low-k dielectric layers formed of low-k dielectric materials. The dielectric layers 116 may further include passivation layers, which are formed of non-low-k and dense dielectric materials such as Undoped Silicate-Glass (USG), silicon oxide, silicon nitride, or the like, or combinations thereof over the low-k dielectric materials. The dielectric layers 116 may also include polymer layers.

The conductive features 118 may include conductive lines and vias, which may be formed using damascene processes. Conductive features 118 may include metal lines and metal vias, which includes diffusion barriers and a copper containing material over the diffusion barriers. There may also be aluminum pads over and electrically connected to the metal lines and vias. As will be explained in greater detail below, contacts to the lower gate stacks 90L and the lower source/drain regions 62L may be made through a backside of the device layer 112 (e.g., a side opposite to the front-side interconnect structure 114).

Figure 7:
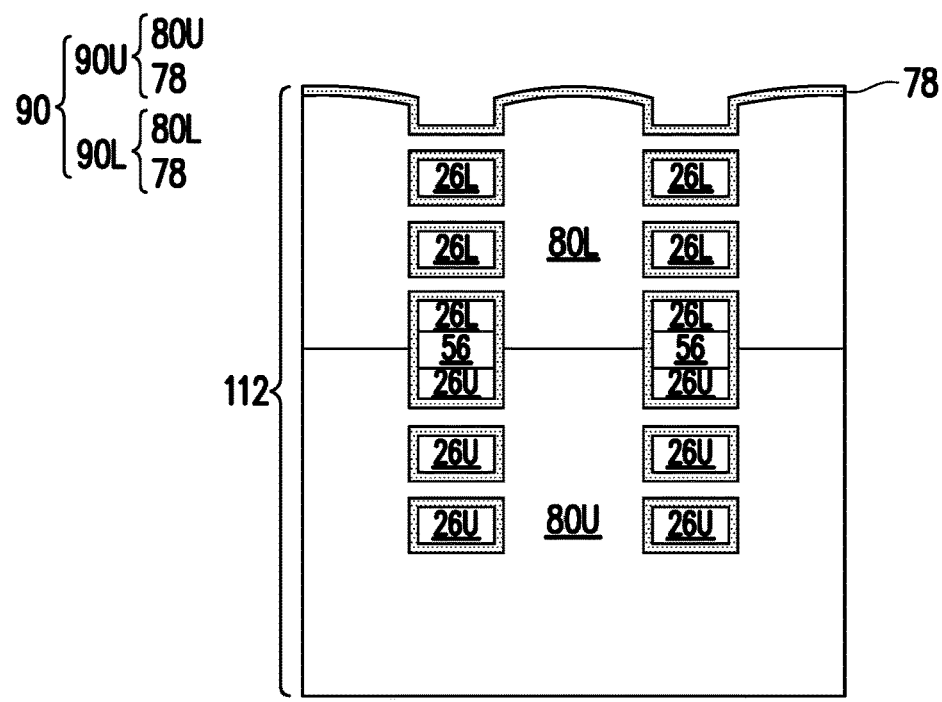

FIGS. 7 through 11B illustrate cross-sectional views of intermediate steps of forming backside gate contacts and source/drain contacts to the lower gate stacks 90L and the lower source/drain regions 62L in accordance with some embodiments. In FIGS. 7 through 10 and 11B, features on the front-side of the device layer 112 beyond the upper gate electrode 80U are omitted for ease of illustration, but it should be understood that the ESL 104, the third ILD 106, and the front-side interconnect structure 114 are disposed below the upper gate electrode 80U in the cross-sections illustrated by FIGS. 7 through 10 and 11B. Referring to FIG. 7, an orientation of the device may be flipped. For example, a carrier substrate (not explicitly illustrated) may be bonded to the front-side interconnect structure 114 by dielectric-to-dielectric bonding, and the device may be flipped to expose a backside of the device layer 112 (e.g., the side of the substrate 20 opposite to the front-side interconnect structure 114).

A planarization process may then be performed on the backside of the device layer 112 (e.g., on the substrate 20). In some embodiments, the planarization process may include a combination of CMP and/or etch-back processes, for example. The planarization process and/or etching processes may remove the substrate 20, exposing the semiconductor strips 20' and the STI regions 32. Then, one or more etching processes are performed to remove the semiconductor strips 20' and the STI regions 32. Removing the semiconductor substrate 20 and the semiconductor strips 20' advantageously improves electrical performance by improving isolation between subsequently formed backside gate contacts and/or backside source/drain contacts. For example, by removing the semiconductor substrate 20 and the semiconductor strips 20', concerns regarding backside contact shorting through the semiconductor substrate 20/semiconductor strips 20' may be addressed. STI regions 32 may also be removed so that a backside gate ESL can be blanketed over the backside of the lower gate electrodes 80L. The semiconductor strips 20' and the STI regions 32 may be removed by any suitable etching process(es) and in any order. The etching process(es) may selectively etch the material of the semiconductor strips 20' and/or the STI regions 32 at a faster rate than surrounding features such that the lower source/drain regions 62L are not significantly etched or damaged during the removal of the semiconductor strips 20' or the removal of the STI regions 32. In some embodiments, the semiconductor strips 20' are removed by wet etching process(es) while the STI regions 32 are removed by dry etching process(es). Removing the semiconductor strips 20' and the STI regions 32 exposes the gate dielectric layers 78. Optionally, in some embodiments, removing the semiconductor strips 20' may partially recess the lower source/drain regions 62L to a same level as or below a back surface of the lower gate stacks 90L (not explicitly illustrated).

Figure 8:
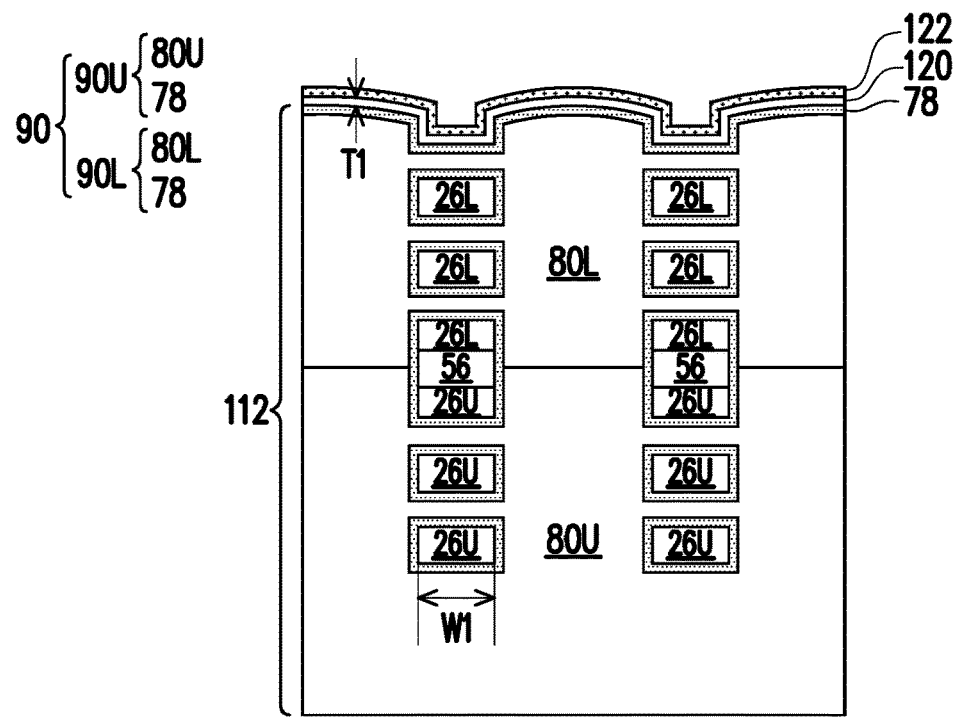

In FIG. 8, a backside gate ESL 120 and backside ESL 122 are successively deposited over a backside of the device layer 112, such as over the gate dielectric layers 78. As a result, the gate dielectric layers 78 may be disposed between the backside gate ESL 120 and the lower gate electrode 80L along a line perpendicular to a backside of the lower gate electrode 80L. The backside gate ESL 120 may be a metal-comprising layer, such as a metal oxide, or the like. In some embodiments, the backside gate ESL 120 has a k-value of at least 9 and comprises aluminum oxide, hafnium silicon oxide, zirconium oxide, or the like. In still other embodiments, the backside gate ESL may comprise a different material, such as silicon oxynitride, silicon nitride, or the like. The backside gate ESL 120 may be deposited by any suitable process, such as PVD, CVD, ALD, or the like. The backside gate ESL 120 protects the lower gate electrode 80L and the nanostructures 26 during subsequent patterning processes to form backside gate contact openings (e.g., contact openings 130, see FIG. 10). In some embodiments, the backside gate ESL 120 may have a thickness T1 that is sufficiently thick to provide adequate protection to the lower gate electrode 80L and the nanostructures 26. In some embodiments, the thickness T1 of the backside gate ESL 120 is at least 2 nm to provide sufficient protection to the lower gate electrode 80L and the nanostructures 26 during subsequent gate contact opening steps. For example, the thickness T1 of the backside gate ESL 120 may be in a range of 2 nm to 10 nm. When the thickness T1 of the backside gate ESL 120 is greater than 10 nm, undue contact resistance may result.

The backside gate ESL 120 allows for subsequently formed backside gate contacts (e.g., gate contacts 132, see FIGS. 11A and 11B) to directly overlap the nanostructures 26. The locations overlapped by channel regions (e.g., nanostructures 26) of the stacking transistor no longer need to be avoided when forming backside gate contacts. As a result, improved routing flexibility and nanostructures 26 with larger widths W1 that provide improved device speed can be achieved. For example, between 14.4% to 19% device speed improvements have been observed in embodiment devices by increasing the widths of the channel regions. In some embodiments the width W1 of the nanostructures is greater than 34 nm, such as in a range of 10 nm to 65 nm, thereby achieving improved device performance. As a result, various embodiments allow for improved process integration, increased routing flexibility, and increased device performance (e.g., speed).

The backside ESL 122 may be formed using similar materials and processes as the front side ESL 104 described above, and detailed description of the backside ESL 122 is omitted for brevity. The backside ESL 122 may provide additional etching control during backside gate contact formation as well as etching control during backside source/drain contact formation. For example, the backside ESL 122 may provide endpoint control for patterning backside source/drain contact openings that expose the lower source/drain regions 62L.

Figure 9:
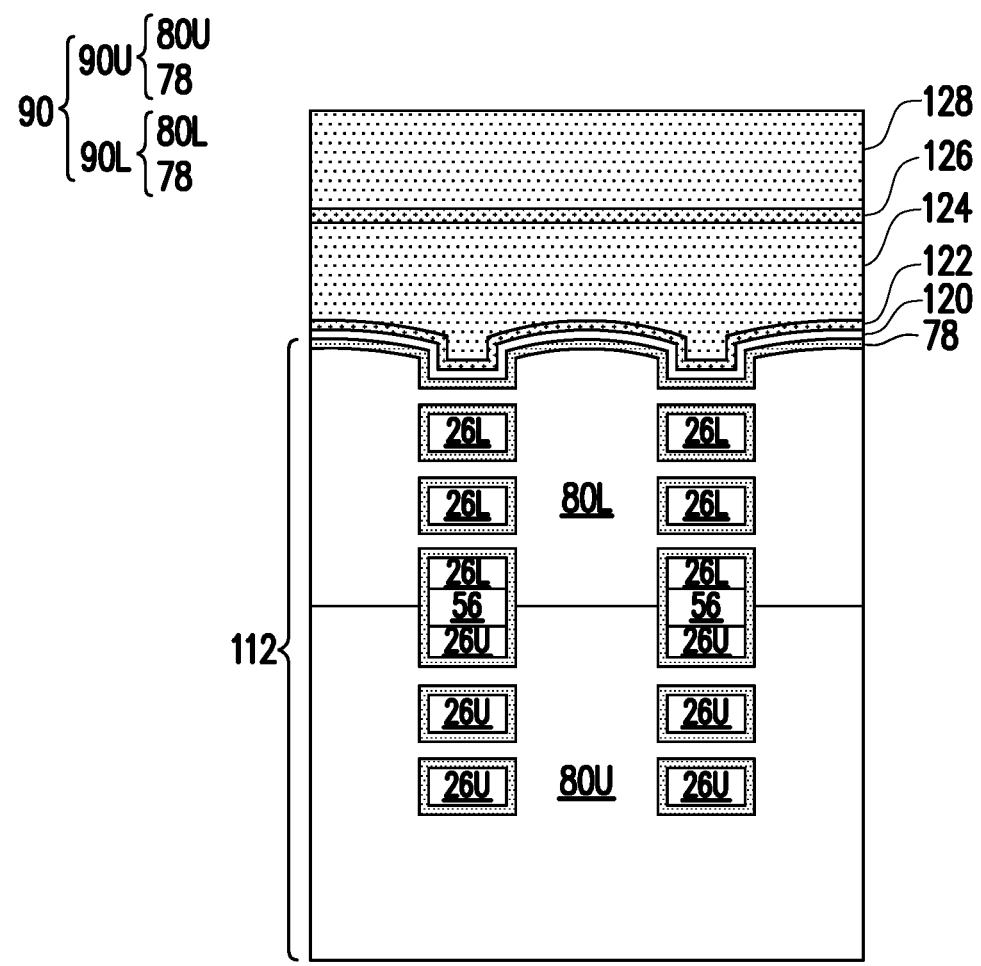

In FIG. 9, a first backside ILD 124, a backside ESL 126, and a second backside ILD 128 are sequentially deposited over the backside ESL 122. The backside ESL 126 may be formed using similar materials and processes as the front side ESL 104 described above, and the first and second backside ILDs 124 and 128 may be formed using similar materials and processes as the third ILD 106 described above.

Figure 11A:
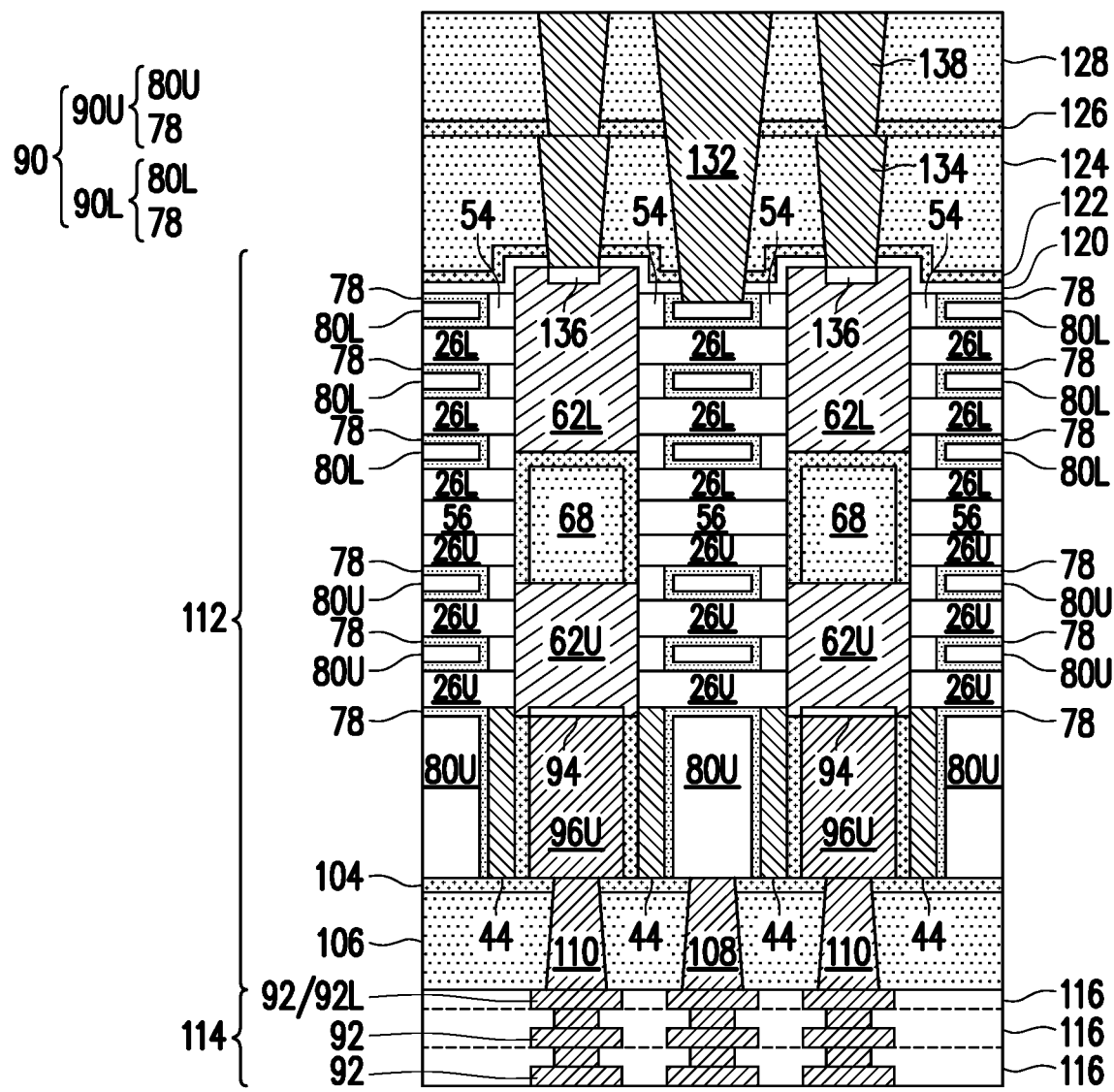

In some embodiments, between depositing the first backside ILD 124 and depositing the backside ESL 126, backside source/drain contacts 134 and metal-semiconductor alloy regions 136 (also referred to as silicide regions 136) are formed (see FIG. 11A). The backside source/drain contacts 134 and the metal-semiconductor alloy regions 136 may be formed using similar materials and processes as the source/drain contacts 96 and the metal-semiconductor alloy regions 94, respectively, described above. In some embodiments, a planarization process may performed on the first backside ILD 124 to remove excess material while forming the source/drain contacts 134. The planarization process (e.g., a CMP process or the like) may further remove any undesired topography from a top surface of the first backside ILD 124 to provide a relatively flat (within process variation) surface upon which subsequent layers can be formed. The backside source/drain contacts 134 may extend through the first backside ILD 124, the backside ESL 122, and the backside gate ESL 120 to electrically couple to the backside of the lower source/drain regions 62L. The backside ESL 122 may provide end point control for etching backside source/drain contact openings that are later filled to form the backside source/drain contacts 134.

Figure 10:
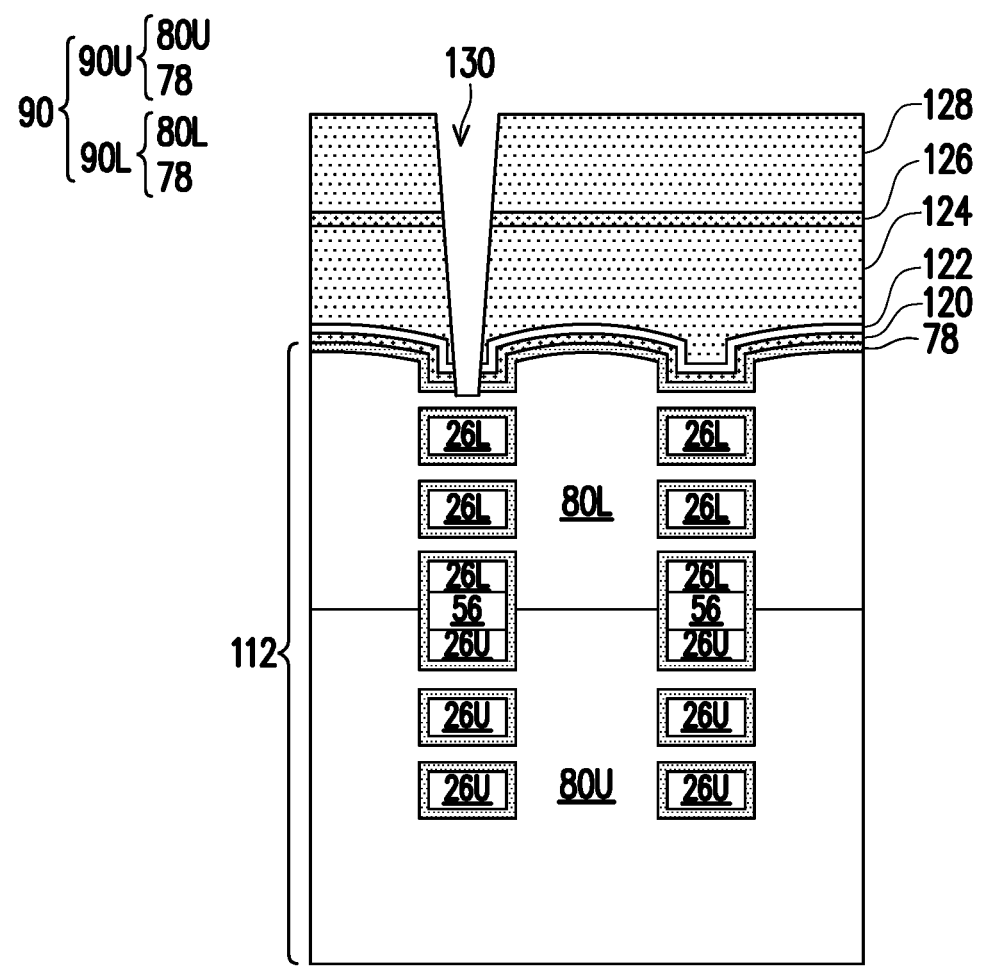

In FIG. 10, backside gate contact openings 130 are patterned through the second backside ILD 128, the backside ESL 126, the first backside ILD 124, the backside ESL 122, the backside gate ESL 120, and the gate dielectric 78 to expose the lower gate electrode 80L. Patterning the backside gate contact openings 130 may be achieved by a combination of lithography and etching process(es). In particular, etching the backside gate ESL 120 may use an etchant that selectively etches the backside gate ESL 120 at a faster rate than surrounding features of the lower nanostructure-FET (e.g., the lower gate electrode 80L and/or the nanostructures 26). In some embodiments, etching the backside gate ESL 120 may include an anisotropic etching process with an etching gas, such as a fluorine-based etchant. Embodiment fluorine-based etchants include $F_2$, HF, or the like. Further, an inert, carrier gas may also be flowed during the anisotropic etching process. For example, the carrier gas may be include Ar, He, $N_2$, combinations thereof, or the like.

The backside gate contact openings 130 may overlap and be laterally aligned with the nanostructures 26, which provide the channel regions of the upper nanostructure-FETs and the lower nanostructure-FETs in the device layer 112. The backside gate ESL 120 is made of a suitable material and is sufficiently thick to allow the backside gate contact openings 130 to be patterned with precise end-point control. For example, the backside gate ESL 120 is made of a metal oxide (e.g., aluminum oxide) and is at least 2 nm thick in various embodiments. As a result, the backside gate contact openings 130 can directly overlap the nanostructures 26 without damaging the nanostructures 26 (e.g., by over etching). The backside ESL 122 is also included to further improve the end-point control of etching the backside gate contact openings 130.

Figure 11B:
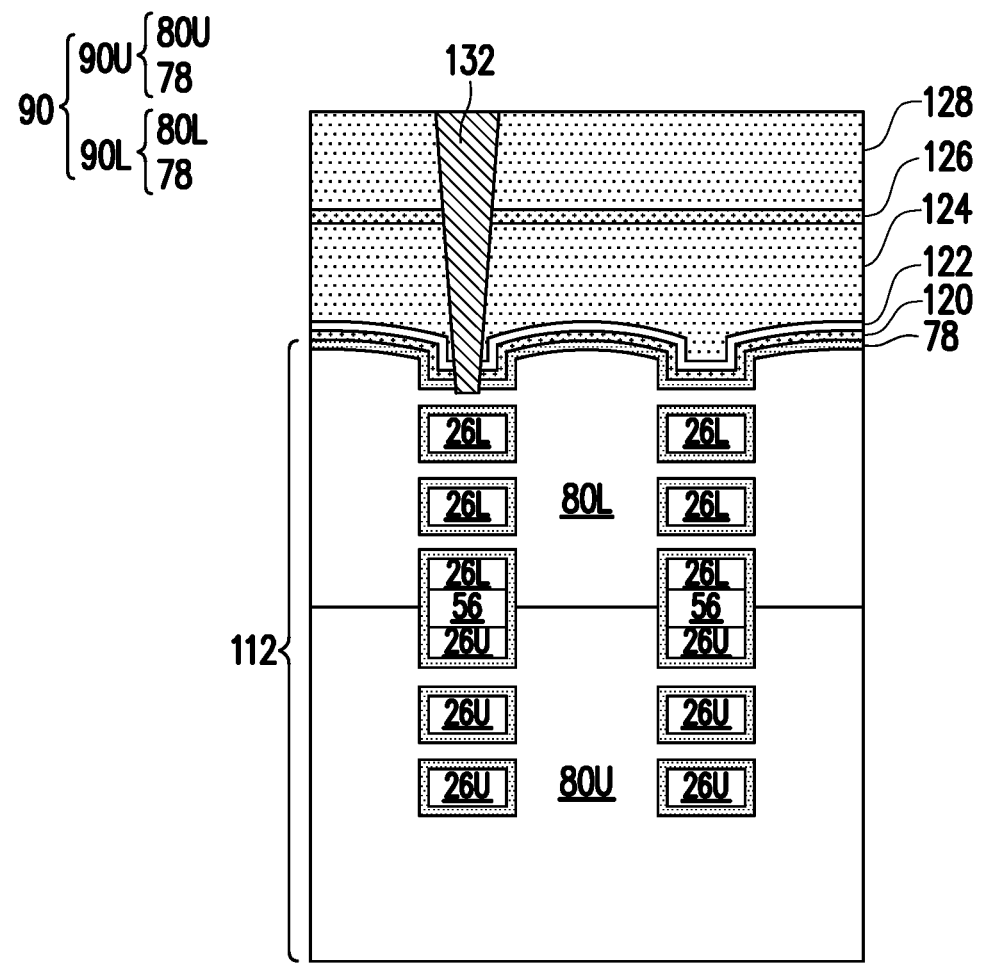

In FIGS. 11A and 11B, backside gate contacts 132 and backside source/drain vias 138 are formed to contact the lower gate electrodes 80L and the source/drain contacts 134, respectively. Specifically, the backside gate contacts 132 may be formed in the backside gate contact openings 130 and overlap the nanostructures 26. As an example to form the backside gate contacts 132, a liner (not separately illustrated), such as a diffusion barrier layer, an adhesion layer, or the like, and a conductive material are formed in the backside gate contact openings 130. The liner may include titanium, titanium nitride, tantalum, tantalum nitride, or the like. The conductive material may be cobalt, titanium, tungsten, ruthenium, tantalum, aluminum, molybdenum, or the like. A planarization process, such as a CMP, may be performed to remove excess material from the top surface of the second backside ILD 128. The remaining liner and conductive material form the backside gate contacts 132 in the backside gate contact openings 130. The backside source/drain vias 138 may be formed of a similar material and process as the source/drain vias 110 described above. The backside gate contacts 132 and the backside source/drain vias 138 may be formed in distinct processes, or may be formed in the same process. Although shown as being formed in the same cross-section, it should be appreciated that each of the backside gate contacts 132 and the backside source/drain vias 138 may be formed in different cross-sections, which may avoid shorting of the contacts. Further, although the backside gate contacts 132 is illustrated as extending through a specific number of backside ILDs (e.g., backside ILDs 124 and 128) and backside ESLs (e.g., ESLs 120, 122, and 126), the backside gate contacts 132 can extend through any number of backside ILDs and backside ESLs depending on backside routing configurations and the corresponding processing steps for forming the backside routing (e.g., backside source/drain contacts, backside interconnects, or the like). For example, in other embodiments, the backside gate contacts 132 may extend through at least an additional backside ESL over the second backside ILD 128 and at least an additional backside ILD over the additional backside ESL.

FIGS. 12A through 17B illustrate the cross-sectional views of intermediate stages in the formation of stacking transistors (as schematically represented in FIG. 1) in accordance with some embodiments. In FIGS. 12A through 17B, like reference numerals indicate like elements formed by like processes as described above in FIGS. 2 through 11B unless otherwise indicated. In FIGS. 12A through 17B, backside gate ESLs 140 are selectively deposited on a backside of the lower gate electrodes 80L instead of forming the blanket deposited, backside gate ESL 120. FIGS. 12A, 13A, 14A, and 17A illustrate cross-sectional views along a similar cross-section as reference cross-section A-A' in FIG. 1. FIGS. 12B, 13B, 14B, 15, 16, and 17B illustrates cross-sectional views along a similar cross-section as reference cross-section B-B' in FIG. 1.

Figure 12A:
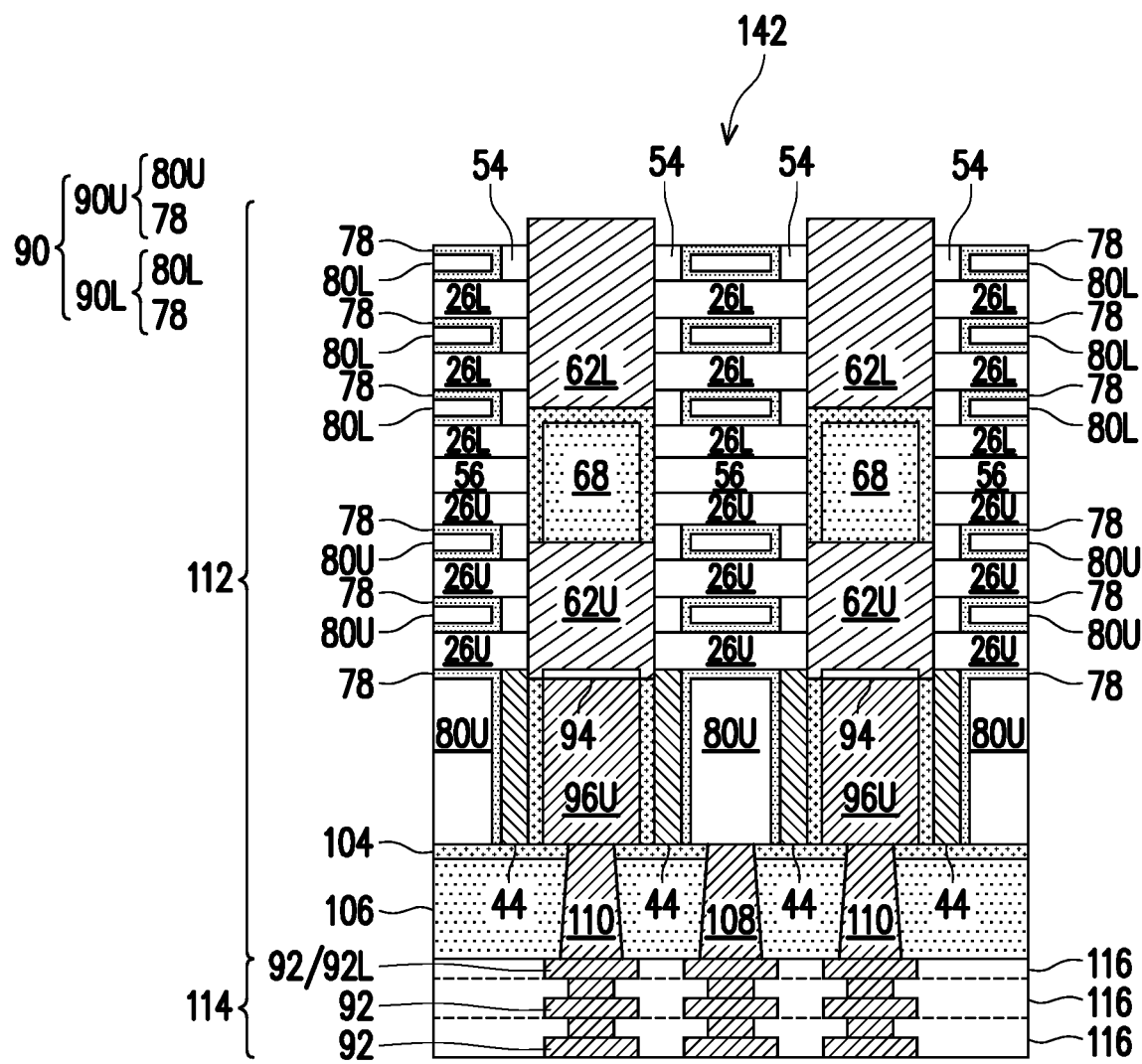
FIGS. 12A, 12B, 13A, 13B, 14A, 14B, 15, 16, 17A, and 17B are views of intermediate stages in the manufacturing of a stacking transistor in accordance with some embodiments
Figure 12B:
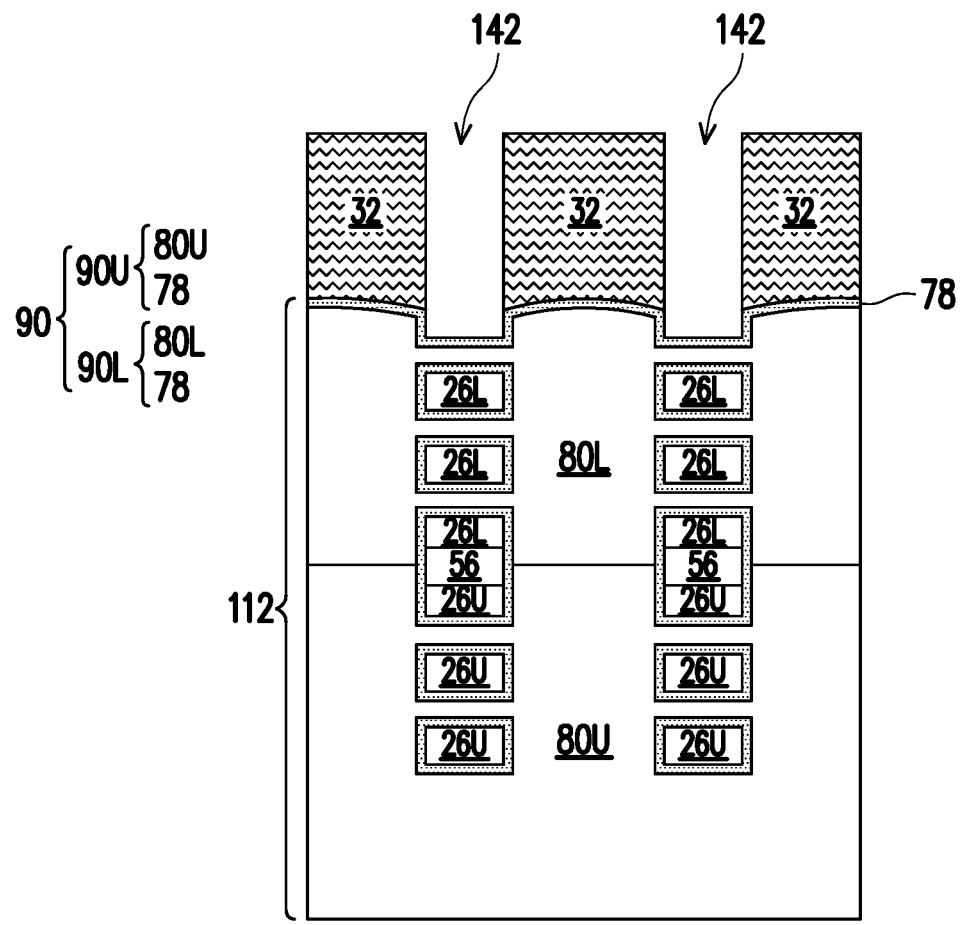

FIGS. 12A and 12B illustrate a device in an intermediate stage of processing similar to the intermediate structure of FIG. 7 where like reference numerals indicate like elements formed by like processes. Specifically, in FIGS. 12A and 12B, the device layer 112 (comprising the gate stacks 90, the source/drain regions 62, and the nanostructures 26) are formed as described above, and the front-side interconnect structure 114 is formed on the device layer 112. Then a carrier substrate (not explicitly illustrated) is bonded to the front-side interconnect structure 114; the intermediate structure is flipped over; and the semiconductor substrate 20 and the semiconductor strips 20' are removed using similar processes as described above. However, the STI regions 32 have not yet been removed in FIGS. 12A and 12B. Removing the semiconductor strips 20' defines openings 142 in the STI regions 32, which corresponds to the locations of the removed, semiconductor strips 20'. The openings 142 expose portions of the gate dielectric layers 78 on the backside of the lower gate electrodes 80L.

Figure 13A:
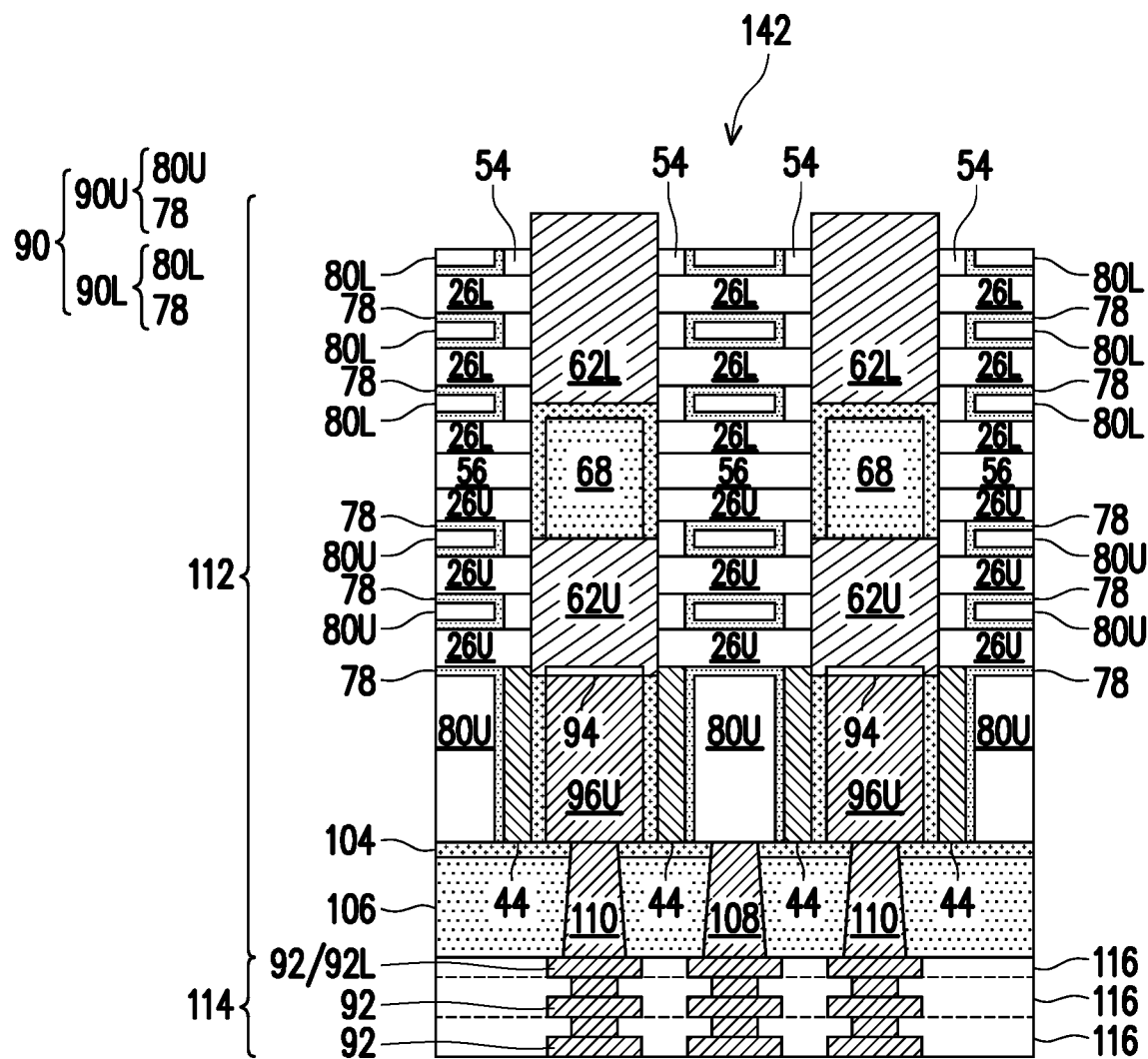
Figure 13B:
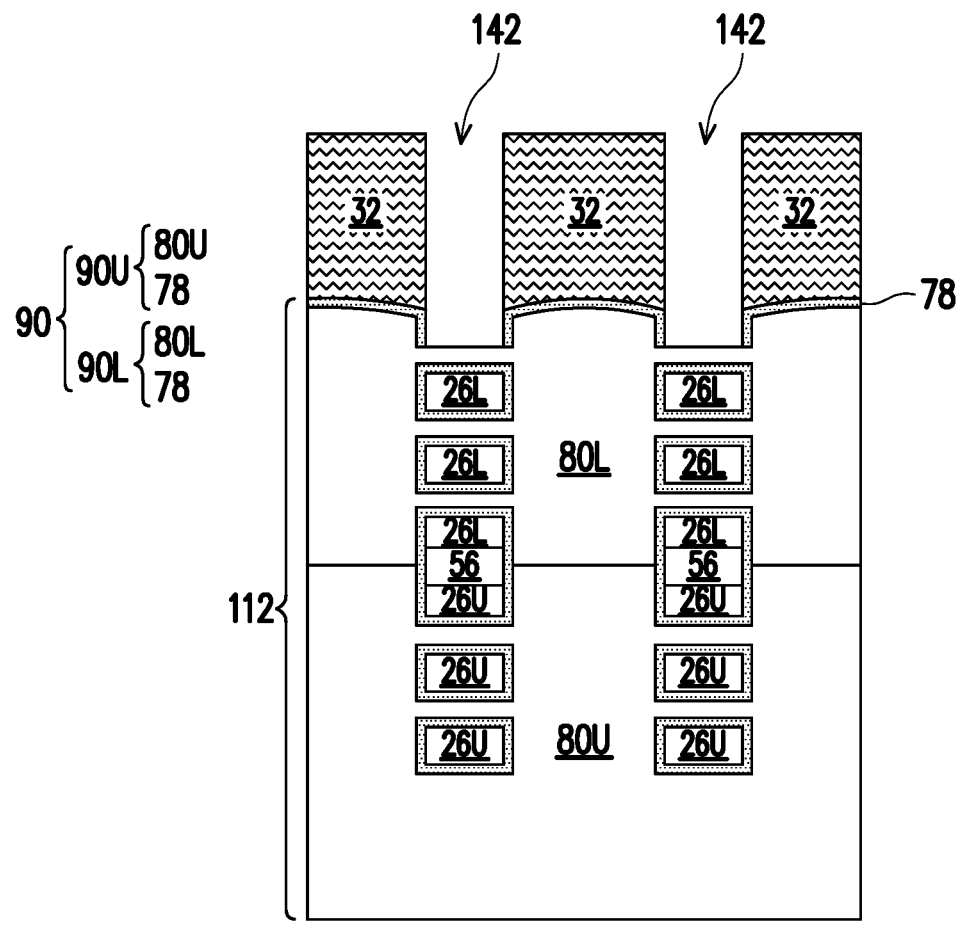

In FIGS. 13A and 13B, the portions of the gate dielectric layers 78 in the openings 142 are etched away to expose the lower gate electrodes 80L. For example, the STI regions 32 act as a masking during the etching of the gate dielectric layers 78 so that only portions of the gate dielectric layers 78 that overlaps the nanostructures 26 are etched away. The gate dielectric layers 78 may be selectively etched with an etchant (e.g., diluted hydrofluoric acid (dHF), or the like) that removes the material(s) of the gate dielectric layers 78 at a faster rate than the surrounding structures. For example, the gate dielectric layers 78 in the openings 142 may be etched away without significantly removing the material of the lower gate electrodes 80L or the material of the lower source/drain regions 62L. In some embodiments, etching the gate dielectric layers 78 includes first etching an interfacial layer of the gate dielectric layers 78 and then etching a high-k gate dielectric of the gate dielectric layers 78. In some embodiments, etching the gate dielectric layers 78 may also include slightly etching the inner spacers 54 that are exposed by the openings 142. For example, after the etching processes, lateral surfaces of the gate dielectric layers 78 and the inner spacers 54 in the openings 142 may be disposed at a same level. In other embodiments, the lateral surfaces of the gate dielectric layers 78 may be disposed at a lower or higher level than the lateral surfaces of inner spacers 54 in the openings 152.

Figure 14A:
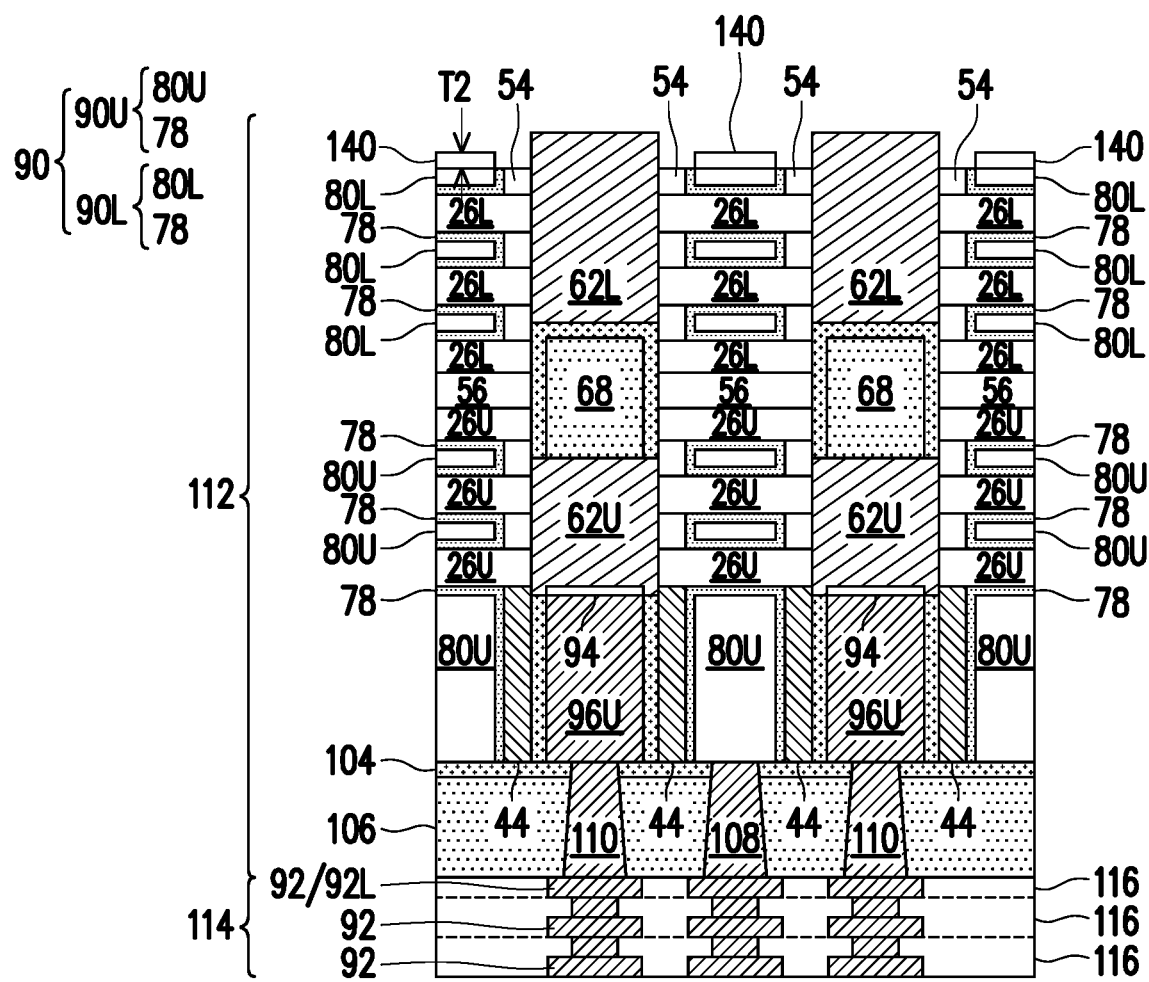
Figure 14B:
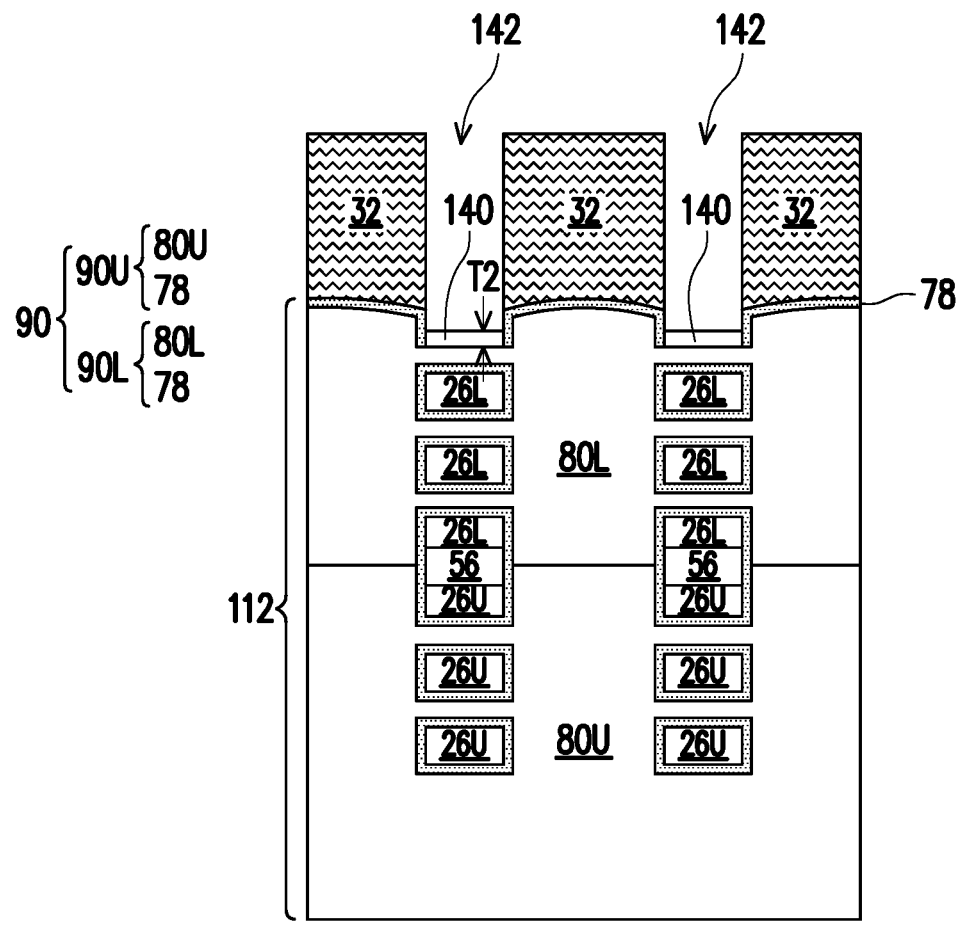

In FIGS. 14A and 14B, the backside gate ESLs 140 are selectively deposited on the exposed lower gate electrodes 80L in the openings 142. As such, the resulting backside gate ESLs 140 may be in direct physical contact with the backside of the lower gate electrodes 80L. The backside gate ESLs 140 may be metal layers made of, for example, cobalt, titanium, tungsten, ruthenium, tantalum, aluminum, molybdenum, combinations thereof, or the like. The backside gate ESLs 140 are grown on the lower gate electrodes 80L with a bottom-up, selective process that is grown directionally (e.g., in a direction away from the lower gate electrode 80L). For example, the backside gate ESLs 140 may be grown by an electroless plating process using the lower gate electrode 80L as a seed layer. Because the electroless plating process is a selective, bottom-up process, the backside gate ESLs 140 may be grown on the lower gate electrodes 80L without being formed on the lower source/drain regions 62L or the inner spacers 54.

Figure 17A:
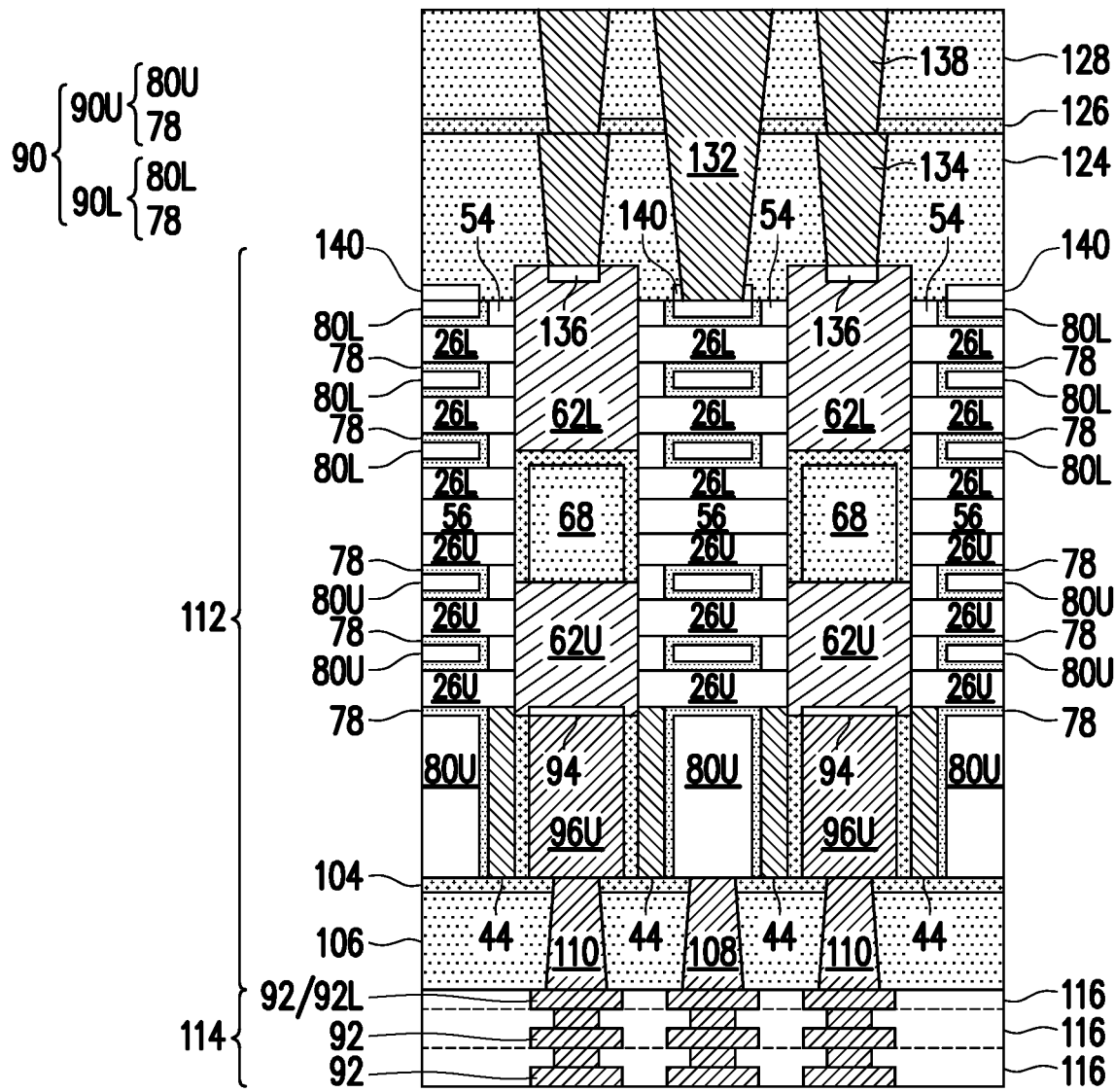
Figure 17B:
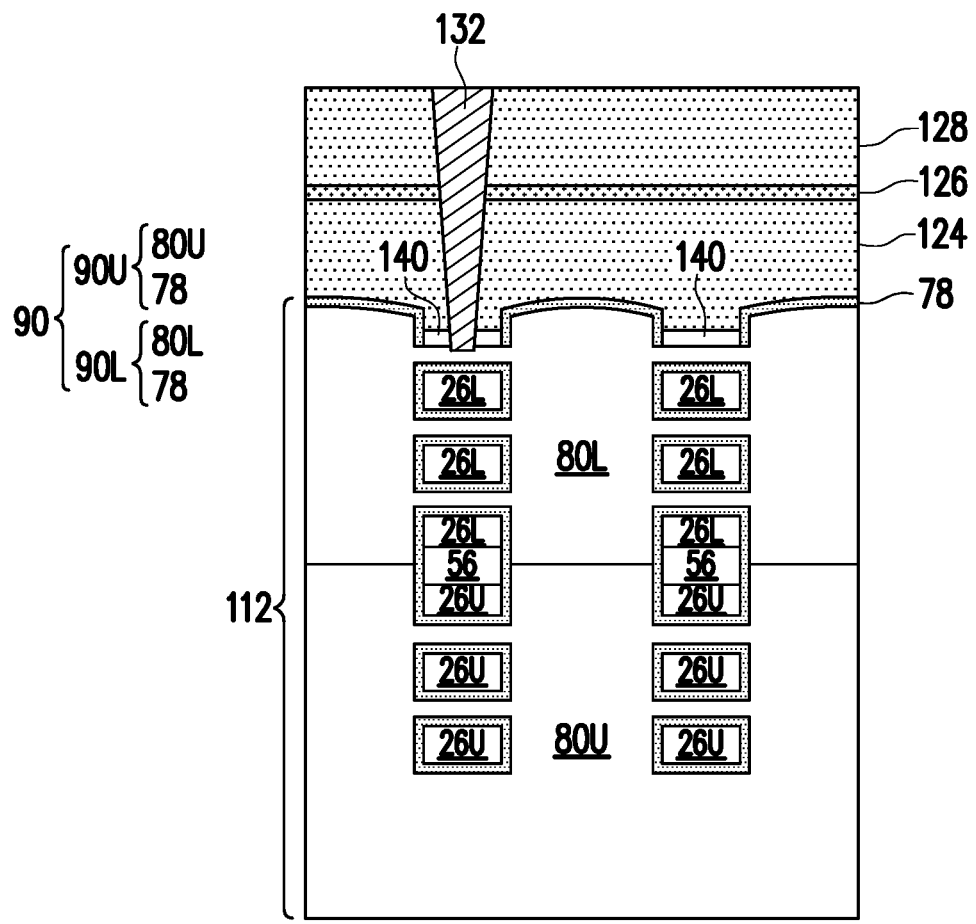

The backside gate ESLs 140 protect the lower gate electrode 80L and the nanostructures 26 during subsequent patterning processes to form backside gate contact openings (e.g., contact openings for the backside gate contacts 132, see FIGS. 17A and 17B). As a result, the backside gate ESLs 140 may each have a thickness T2 that is sufficiently thick to provide adequate protection to the lower gate electrode 80L and the nanostructures 26. In some embodiments, the thickness T2 of the backside gate ESLs 140 is at least 4 nm to provide sufficient protection to the lower gate electrode 80L and the nanostructures 26 during subsequent gate contact opening steps. For example, the thickness T2 of the ESL 140 may be in a range of 4 nm to 10 nm. When the thickness T2 of the backside gate ESL 140 is greater than 10 nm, undue contact resistance may result.

The backside gate ESLs 140 allows for subsequently formed backside gate contacts (e.g., gate contacts 132, see FIGS. 11A and 11B) to directly overlap the nanostructures 26. The locations overlapped by channel regions (e.g., nanostructures 26) of the stacking transistor no longer need to be avoided when forming backside gate contacts. As a result, improved routing flexibility and nanostructures 26 with larger widths that provide improved device speed can be achieved. For example, between 14.4% to 19% device speed improvements have been observed in embodiment devices by increasing the widths of the channel regions. Further, by forming the backside gate ESLs 140 of a metal described above (e.g., cobalt, titanium, tungsten, ruthenium, tantalum, aluminum, molybdenum), contact resistance between the backside gate contact and the lower gate electrode 80L can be reduced. As a result, various embodiments allow for improved process integration, increased routing flexibility, and increased device performance (e.g., speed and lower contact resistance).

Figure 15:
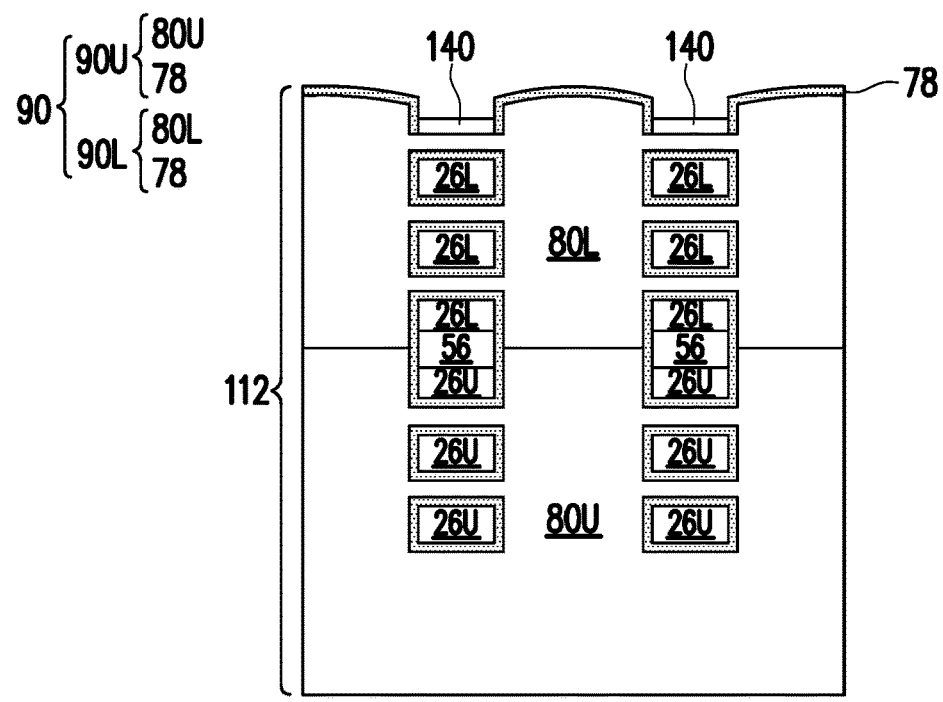
Figure 16:
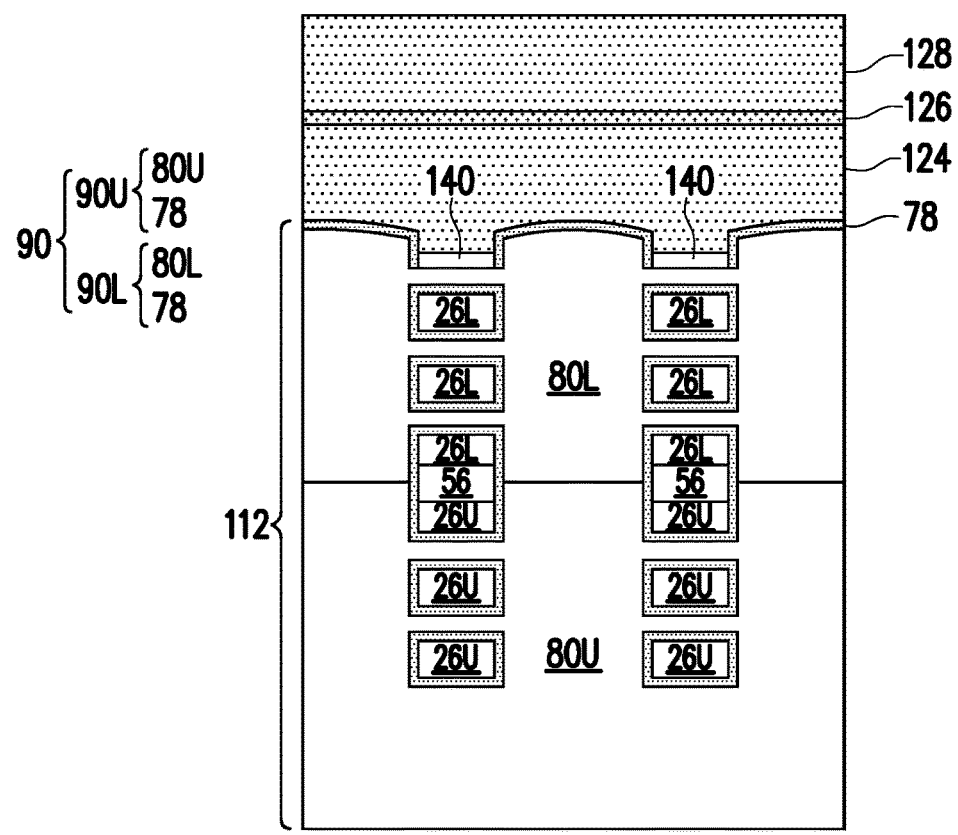

In FIG. 15, the STI regions 32 are removed are removed using similar processes as described above with respect to FIG. 7. Removing the STI regions 32 allows for it to be replaced a better quality dielectric film (e.g., the first backside ILD 124) for improved isolation of backside contact and metallization features. In FIG. 16, the first backside ILD 124, the backside ESL 126, and the second backside ILD 128 are sequentially deposited over the backside gate ESLs 140 and the lower gate electrodes 80L. Depositing the first backside ILD 124, the backside ESL 125, and the second backside ILD 128 may be formed by a similar process and method as described above with respect to FIG. 9 and are not repeated herein for brevity. In some embodiments, the first backside ILD 124 may extend along and directly contact sidewalls of the backside gate ESL 140 as well as a lateral surface of the inner spacers 54 (see FIG. 17A). The first backside ILD 124 may further extend between the backside gate ESL 140 and the lower source/drain regions 62L.

In some embodiments, between depositing the first backside ILD 124 and depositing the backside ESL 126, backside source/drain contacts 134 and metal-semiconductor alloy regions 136 (also referred to as silicide regions 136) are formed (see FIG. 17A). The backside source/drain contacts 134 and the metal-semiconductor alloy regions 136 may be formed using similar materials and processes as described above. The backside source/drain contacts 134 may extend through the first backside ILD 124 to electrically couple to the backside of the lower source/drain regions 62L.

In FIGS. 17A and 17B, backside gate contacts 132 are formed extending through the second backside ILD 128, the backside ESL 126, the first backside ILD 124, and the backside gate ESLs 140 to electrically couple the lower gate electrodes 80L. The backside gate contacts 132 may be formed of similar processes and materials as those discussed above. For example, gate contact openings are patterned through the second backside ILD 128, the backside ESL 126, the first backside ILD 124, and the backside gate ESLs 140 to expose the lower gate electrode 80L using a combination of lithography and etching process(es). Etching the backside gate ESLs 140 may use an etchant that selectively etches the backside gate ESLs 140 at a faster rate than surrounding features of the lower nanostructure-FET (e.g., the lower gate electrode 80L and/or the nanostructures 26).

The backside gate contacts 132 may overlap and be laterally aligned with the nanostructures 26, which provide the channel regions of the upper nanostructure-FETs and the lower nanostructure-FETs in the device layer 112. The backside gate ESLs 140 are made of a suitable material and is sufficiently thick to allow the backside gate contact openings to be patterned with precise end-point control. For example, the backside gate ESLs 140 is made of a metal (e.g., cobalt, titanium, tungsten, ruthenium, tantalum, aluminum, molybdenum, or the like) and is at least 4 nm thick in various embodiments. As a result, the backside gate contacts 132 can directly overlap the nanostructures 26 without damaging the nanostructures 26 (e.g., by over etching). Further, a metal backside gate ESL provides an additional benefit of reduced contact resistance between the backside gate contacts 132 and the lower gate electrodes 80L.

As an example to form the backside gate contacts 132, a liner (not separately illustrated), such as a diffusion barrier layer, an adhesion layer, or the like, and a conductive material are formed in the backside gate contact openings 130. The liner may include titanium, titanium nitride, tantalum, tantalum nitride, or the like. The conductive material may be cobalt, titanium, tungsten, ruthenium, tantalum, aluminum, molybdenum, or the like. A planarization process, such as a CMP, may be performed to remove excess material from the top surface of the second backside ILD 128. The remaining liner and conductive material form the backside gate contacts 132 in the backside gate contact openings 130.

As also illustrated by FIGS. 17A and 17B, backside source/drain vias 138 are formed to contact the source/drain contacts 134 using similar processes and materials as described above. The backside gate contacts 132 and the backside source/drain vias 138 may be formed in distinct processes, or may be formed in the same process. Although shown as being formed in the same cross-section, it should be appreciated that each of the backside gate contacts 132 and the backside source/drain vias 138 may be formed in different cross-sections, which may avoid shorting of the contacts. Although the backside gate contacts 132 is illustrated as extending through a specific number of backside ILDs (e.g., backside ILDs 124 and 128) and backside ESLs (e.g., ESLs 140 and 126), the backside gate contacts 132 can extend through any number of backside ILDs and backside ESLs depending on backside routing configurations and the corresponding processing steps for forming the backside routing (e.g., backside source/drain contacts, backside interconnects, or the like). For example, in other embodiments, the backside gate contacts 132 may extend through at least an additional backside ESL over the second backside ILD 128 and at least an additional backside ILD over the additional backside ESL.

Various embodiments provide a backside gate ESL that allows for backside gate contacts to be formed to the lower gate stack at a location where the backside gate contacts are overlapped by the channel regions of the stacking transistor without damaging the channel regions during the backside gate contact formation process. As a result, the locations overlapped by channel regions do not need to be avoided when forming the backside gate contacts, allowing for improved routing flexibility. Further, because channel regions are able to directly overlap the backside gate contacts, channel regions can be designed and fabricated with larger widths for improved device speed. For example, between 14.4% to 19% device speed improvements have been observed in embodiment devices by increasing the widths of the channel regions. The backside gate ESL may be made of a metal or metal oxide, which further reduces contact resistance in the device. As a result, various embodiments allow for improved process integration, increased routing flexibility, and increased device performance.

In some embodiments, a semiconductor device includes a plurality of first nanostructures, the plurality of first nanostructures extending between first source/drain regions; a plurality of second nanostructures over the plurality of first nanostructures, the plurality of second nanostructure extending between second source/drain regions; a first gate stack around the plurality of first nanostructures; and a second gate stack over the first gate stack and disposed around the plurality of second nanostructures. The semiconductor device further includes a backside gate etch stop layer (ESL) on a backside of the first gate stack and a backside gate contact extending through the backside gate ESL and electrically coupled to the first gate stack. The backside gate ESL comprises a metal. Optionally, in some embodiments, the backside gate ESL is a made of a metal oxide, and wherein the metal oxide is aluminum oxide, hafnium silicon oxide, or zirconium oxide. Optionally, in some embodiments, a thickness of the backside gate ESL is at least 2 nm. Optionally, in some embodiments, the backside gate ESL is made of a metal, and wherein the metal is cobalt, titanium, tungsten, ruthenium, tantalum, aluminum, or molybdenum. Optionally, in some embodiments, a thickness of the backside gate ESL is at least 4 nm. Optionally, in some embodiments, the plurality of first nanostructures overlaps the backside gate contact. Optionally, in some embodiments, the backside gate ESL is in direct physical contact with a first gate electrode of the first gate stack. Optionally, in some embodiments, the first gate stack comprises one or more gate dielectrics between a first gate electrode of the first gate stack and the plurality of first nanostructures, wherein the one or more gate dielectrics is further disposed between the backside gate ESL and the first gate electrode. Optionally, in some embodiments, the semiconductor device further includes a backside ESL contacting a surface of the backside gate ESL that is opposite to the first gate stack, and the backside gate contact extends through the backside ESL. Optionally, in some embodiments, the semiconductor device further includes a backside interlayer dielectric (ILD) on an opposite side of the backside gate ESL as the first gate stack, wherein the backside gate contact extends through the backside ILD. Optionally, in some embodiments, the backside ILD contacts a sidewall of the backside gate ESL.

In some embodiments, a method includes forming a first transistor and a second transistor over a semiconductor substrate, wherein the first transistor and the second transistor are vertically stacked; exposing a backside of a first gate stack of the first transistor, wherein exposing the backside of the first gate stack comprises removing the semiconductor substrate; forming a backside gate etch stop layer (ESL) on the backside of the first gate stack; patterning a contact opening through the backside gate ESL to expose the first gate stack; and forming a backside gate contact in the contact opening. The backside gate contact extends through the backside gate ESL to electrically connect to the first gate stack. Optionally, in some embodiments, the first gate stack comprises a gate dielectric and a gate electrode, and wherein forming the backside gate ESL comprises blanket depositing the backside gate ESL over the gate dielectric. Optionally, in some embodiments, the method further includes blanket depositing an additional ESL on a surface of the backside gate ESL opposite to the first transistor, wherein patterning the contact opening comprises patterning the contact opening through the additional ESL and the gate dielectric. Optionally, in some embodiments, the first gate stack comprises a gate dielectric and a gate electrode, and wherein forming the backside gate ESL comprises selectively depositing the backside gate ESL on the gate electrode. Optionally, in some embodiments, exposing the backside of the first gate stack further comprises defining an opening in a shallow trench isolation (STI) region by removing a semiconductor fin, the method further includes removing a portion of the gate dielectric exposed by the opening in the STI region, wherein forming the backside gate ESL comprises selectively depositing the backside gate ESL in the opening. Optionally, in some embodiments, the backside gate ESL comprises a metal or a metal oxide, wherein the first transistor comprises a plurality of nanostructures, and patterning the contact opening comprises patterning the contact opening in a location that overlaps the plurality of nanostructures.

In some embodiments, A method includes forming a multi-layer stack over a semiconductor substrate, the multi-layer stack comprising alternating semiconductor nanostructures and dummy nanostructures; forming lower source/drain regions, wherein lower semiconductor nanostructures of the semiconductor nanostructures extend between the lower source/drain regions; and forming upper source/drain regions over the lower source/drain regions, wherein upper semiconductor nanostructures of the semiconductor nanostructures extend between the upper source/drain regions. The method further includes replacing the dummy nanostructures with a lower gate stack around the lower semiconductor nanostructures and an upper gate stack around the upper semiconductor nanostructures; exposing a backside of the lower gate stack; depositing a metal-comprising backside gate etch stop layer (ESL) on the backside of the lower gate stack; and forming a backside gate contact extending through the metal—comprising backside gate ESL to electrically connect to the lower gate stack. The backside gate contact overlaps the lower semiconductor nanostructures and the upper semiconductor nanostructures. Optionally, in some embodiments, depositing the metal—comprising backside gate ESL comprises a blanket deposition process. Optionally, in some embodiments, depositing the metal-comprising backside gate ESL comprises a selective deposition process.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a first transistor and a second transistor over a semiconductor substrate, wherein the first transistor and the second transistor are vertically stacked;
   exposing a backside of a first gate stack of the first transistor, wherein exposing the backside of the first gate stack comprises removing the semiconductor substrate;
   forming a backside gate etch stop layer (ESL) on the backside of the first gate stack;
   patterning a contact opening through the backside gate ESL to expose the first gate stack; and
   forming a backside gate contact in the contact opening, wherein the backside gate contact extends through the backside gate ESL to electrically connect to the first gate stack.

2. The method of claim 1, wherein the first gate stack comprises a gate dielectric and a gate electrode, and wherein forming the backside gate ESL comprises blanket depositing the backside gate ESL over the gate dielectric.

3. The method of claim 2 further comprising blanket depositing an additional ESL on a surface of the backside gate ESL opposite to the first transistor, wherein patterning the contact opening comprises patterning the contact opening through the additional ESL and the gate dielectric.

4. The method of claim 1, wherein the first gate stack comprises a gate dielectric and a gate electrode, and wherein forming the backside gate ESL comprises selectively depositing the backside gate ESL on the gate electrode.

5. The method of claim 4, wherein exposing the backside of the first gate stack further comprises defining an opening in a shallow trench isolation (STI) region by removing a semiconductor fin, wherein the method further comprises:
   removing a portion of the gate dielectric exposed by the opening in the STI region, wherein forming the backside gate ESL comprises selectively depositing the backside gate ESL in the opening.

6. The method of claim 1, wherein the backside gate ESL comprises a metal or a metal oxide, wherein the first transistor comprises a plurality of nanostructures, and wherein patterning the contact opening comprises patterning the contact opening in a location that overlaps the plurality of nanostructures.

7. A method comprising:
   forming a multi-layer stack over a semiconductor substrate, the multi-layer stack comprising alternating semiconductor nanostructures and dummy nanostructures;
   forming lower source/drain regions, wherein lower semiconductor nanostructures of the semiconductor nanostructures extend between the lower source/drain regions;
   forming upper source/drain regions over the lower source/drain regions, wherein upper semiconductor nanostructures of the semiconductor nanostructures extend between the upper source/drain regions;
   replacing the dummy nanostructures with a lower gate stack around the lower semiconductor nanostructures and an upper gate stack around the upper semiconductor nanostructures;
   exposing a backside of the lower gate stack;
   depositing a metal-comprising backside gate etch stop layer (ESL) on the backside of the lower gate stack; and
   forming a backside gate contact extending through the metal-comprising backside gate ESL to electrically connect to the lower gate stack, wherein the backside gate contact overlaps the lower semiconductor nanostructures and the upper semiconductor nanostructures.

8. The method of claim 7, wherein depositing the metal-comprising backside gate ESL comprises a blanket deposition process.

9. The method of claim 7, wherein depositing the metal-comprising backside gate ESL comprises a selective deposition process.

10. The method of claim 7 further comprising depositing a dielectric ESL over the metal-comprising backside gate ESL, wherein forming the backside gate contact comprises forming the backside gate contact to extend through the dielectric ESL.

11. The method of claim 7, wherein the metal-comprising backside gate ESL is made of aluminum oxide, hafnium silicon oxide, or zirconium oxide.

12. The method of claim 7, wherein a thickness of the metal-comprising backside gate ESL is at least 2 nm.

13. The method of claim 7, wherein exposing the backside of the lower gate stack comprises removing the semiconductor substrate.

14. A method comprising:
   forming a device layer on a semiconductor substrate, the device layer comprising:
      a plurality of first nanostructures, the plurality of first nanostructures extending between first source/drain regions;
      a plurality of second nanostructures over the plurality of first nanostructures, the plurality of second nanostructure extending between second source/drain regions;
      a first gate stack around the plurality of first nanostructures; and
      a second gate stack around the plurality of second nanostructures, wherein the first gate stack is vertically stacked with the second gate stack;
   removing the semiconductor substrate to expose a backside of the first gate stack;
   depositing a backside gate etch stop layer (ESL) on the backside of the first gate stack, wherein the backside gate ESL comprises a metal; and
   patterning an opening through the backside gate ESL, wherein the opening exposes one of the first source/drain regions; and
   filling the opening with a conductive material.

15. The method of claim 14, wherein the backside gate ESL is made of aluminum oxide, hafnium silicon oxide, or zirconium oxide, and wherein a thickness of the backside gate ESL is at least 2 nm.

16. The method of claim 14, further comprising depositing an additional etch stop layer (ESL) over and in direct contact with the backside gate ESL, wherein patterning the opening comprises patterning the opening through the additional ESL.

17. The method of claim 14, wherein patterning the opening comprises patterning the opening to overlap the plurality of first nanostructures.

18. The method of claim 14, wherein depositing the backside gate ESL comprises depositing the backside gate ESL in direct contact with a gate dielectric of the first gate stack.

19. The method of claim 18, wherein patterning the opening comprises patterning the opening through the gate dielectric of the first gate stack.

20. The method of claim 18, wherein depositing the backside gate ESL comprises a blanket deposition process.

* * * * *